United States Patent
Freudenberger et al.

(10) Patent No.: US 10,812,112 B2
(45) Date of Patent: *Oct. 20, 2020

(54) METHODS AND DECODER FOR SOFT INPUT DECODING OF GENERALIZED CONCATENATED CODES

(71) Applicant: HYPERSTONE GMBH, Constance (DE)

(72) Inventors: Juergen Freudenberger, Radolfzell (DE); Jens Spinner, Constance (DE); Christoph Baumhof, Radolfzell (DE)

(73) Assignee: HYPERSTONE GMBH, Constance (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/252,604

(22) Filed: Jan. 19, 2019

(65) Prior Publication Data

US 2019/0173495 A1    Jun. 6, 2019

Related U.S. Application Data

(63) Continuation of application No. 15/594,830, filed on May 15, 2017, now Pat. No. 10,230,403.

(30) Foreign Application Priority Data

May 13, 2016 (DE) .......................... 10 2016 005 914
May 12, 2017 (DE) .......................... 10 2017 110 389

(51) Int. Cl.
*H03M 13/00* (2006.01)
*H03M 13/29* (2006.01)
(Continued)

(52) U.S. Cl.
CPC ..... *H03M 13/293* (2013.01); *H03M 13/1191* (2013.01); *H03M 13/1515* (2013.01);
(Continued)

(58) Field of Classification Search
None
See application file for complete search history.

(56) References Cited

U.S. PATENT DOCUMENTS

| | | | | |
|---|---|---|---|---|
| 5,373,511 A | * | 12/1994 | Veksler | ............... H03M 13/151 |
| | | | | 714/755 |
| 7,958,425 B2 | * | 6/2011 | Chugg | .............. H03M 13/2903 |
| | | | | 714/755 |

(Continued)

OTHER PUBLICATIONS

A. Fahrner et al. "Low-Complexity GEL codes for digital magnetic storage systems" IEEE Transactions on Magnetics, vol. 40, pp. 3093-3095 Jul 2004.

(Continued)

*Primary Examiner* — Mujtaba M Chaudry
(74) *Attorney, Agent, or Firm* — HDC IP Law

(57) ABSTRACT

The invention relates to a soft input decoding method and a decoder for generalized concatenated (GC) codes. The GC codes are constructed from inner nested block codes, such as binary Bose-Chaudhuri-Hocquenghem, BCH, codes and outer codes, such as Reed-Solomon, RS, codes. In order to enable soft input decoding for the inner block codes, a sequential stack decoding algorithm is used. Ordinary stack decoding of binary block codes requires the complete trellis of the code. In one aspect, the present invention applies instead a representation of the block codes based on the trellises of supercodes in order to reduce the memory requirements for the representation of the inner codes. This enables an efficient hardware implementation. In another aspect, the present invention provides a soft input decoding method and device employing a sequential stack decoding algorithm in combination with list-of-two decoding which is particularly well suited for applications that require very low residual error rates.

21 Claims, 12 Drawing Sheets

(51) Int. Cl.
  *H03M 13/35* (2006.01)
  *H03M 13/39* (2006.01)
  *H03M 13/45* (2006.01)
  *H03M 13/11* (2006.01)
  *H03M 13/15* (2006.01)
  *H03M 13/25* (2006.01)
  *G11B 20/18* (2006.01)

(52) U.S. Cl.
  CPC ..... *H03M 13/253* (2013.01); *H03M 13/2906* (2013.01); *H03M 13/2909* (2013.01); *H03M 13/2927* (2013.01); *H03M 13/2948* (2013.01); *H03M 13/2993* (2013.01); *H03M 13/356* (2013.01); *H03M 13/3944* (2013.01); *H03M 13/458* (2013.01); *H03M 13/618* (2013.01); *G11B 2020/1836* (2013.01); *G11B 2020/1859* (2013.01); *H03M 13/152* (2013.01); *H03M 13/29* (2013.01)

(56) References Cited

U.S. PATENT DOCUMENTS

| | | | |
|---|---|---|---|
| 2007/0043998 A1* | 2/2007 | Lakkis | H03M 13/1137 714/758 |
| 2009/0150746 A1* | 6/2009 | Chaichanavong | G11B 20/1426 714/752 |
| 2010/0268918 A1* | 10/2010 | Priewasser | H03M 13/1105 712/208 |
| 2011/0214039 A1* | 9/2011 | Steiner | G06F 11/1012 714/797 |
| 2014/0153625 A1* | 6/2014 | Vojcic | H03M 13/451 375/224 |
| 2015/0236723 A1* | 8/2015 | Dowling | H03M 13/2933 714/755 |
| 2016/0087652 A1* | 3/2016 | Ha | H03M 13/2757 714/755 |

OTHER PUBLICATIONS

J. Freudenberger et al "Concatenated code constructions for error correction in non-volatile memories" (ISSSE) Potsdam, Oct. 2012 pp. 1-6.

J. Freudenberger et al "Generalized concatenated codes for correcting two dimentional cluster fo errors and independent errores" in (CSP) Castelldefels-Barcelona Feb. 2014.

Dumer, "Conatenated codes and their mulitlevel generalizations" in Handbook of Coding Theory, vol. II Elsevier, Amsterdam, 1998—Book (abstract).

Bossert "Channel Coding for Telecommunications" Wiley, 1999—Book (abstract).

Zyablov et al "An introduction to genraized concatenated codes" European Transactions on Communications vol. 10. No. 6. pp. 609-622. 1999.

Spinner et al "Decoder architecture for generalized concatenated codes. "IET Circuits, Devices and Systems, vol. 9 No. 5 pp. 328-335, 2015.

Neubauer et al "Coding theory: algorithms, architectures and applications" John Wiley and Sons, 2007—Book (abstract).

Chase "Class of Algorithms for decoding block codes with channel measurement information" IEEE Transactions on Information Theory vol. IT-18, Jan. 1972.

Argon et al "Iterative application of the chase algorithm on reed-solomon product codes" Preccedings IEEE ICC 2001 pp. 320-324, 2001.

Fossorier et al "Soft-Decision decoding of linear block codes based on ordered statistics" IEEE Trans. Inform. Theory, vol. IT-41 pp. 1379-1396, Sep. 1995.

Dorsch "A decoding algorithm for binary block codes and J-ary output channels" Information Theory, IEEE Transactions on vol. 20, No. 3, pp. 391-394, May 1974.

Tomlinson et al "Extending the dorsch decoder towards achieving maximum-liklihood decoding for linear codes," IET communications, vol. 1 No. 3, pp. 479-488, Jun. 2007.

Gortan et al "Achieving near-MLD performance with soft information-set decoders implemented in FPGAs" 2010 IEEE Asia Pacific Conference Dec. 2010.

Aguado et al "On Hybrid stack decdoing algorithms for block codes" Information Theory, IEEE transactions vol. 44 No. 1 pp. 398-409 Jan. 1998.

Wolf "Efficient maximum likelihood decoding of linear block codes using a trellis" IEEE Transaciton on information theory, vol. 24, No. 1 pp. 76-80, Jan. 1978.

Freudenberger et al "An efficient hardware implementation of sequentional stack decoding of binary block codes" IEEE 5th international conference on consumer electronics Sep. 2015.

Freudenberger et al "Maximum- likelihood decoding based on supercodes" Proc. 4th international ITG Conf. source and channel codeing, Germany Jan. 2004 pp. 185-190.

Freudenberger et al "Bounded distance decoding and decision feedback" Dusseldorf, Germany: VDI Vertag, 2004.

Micheloni et al "Error correction codes for Non-volatile memories", Springer 2008—book (abstract).

Zhang et al "High-speed architectures for parallel long BCH encoders" IEEE Transaction on very large scale integration (VLSI) systems, vol. 13, No. 7, pp. 872-877, 2005.

Sun et al "Design of on-chip error correction systems for multilevel NOR and NAND flash memories," IET circuits, devices systems, vol. 1 No. 3 pp. 241-249, Jun. 2007.

Freudenberger et al "A configurable bose-chaudhuri-hocquenghem codec architecture for flash controller applications" Jnl or curcuits, systems and computers vol. 23, No. 2. Feb. 2014.

Cho et al "Block-wise concatentated BCH codes for NAND flash memories, "IEEE transaction on communications, vol. 62, No. 4 pp. 1164-1177, Apr. 2014.

Kim et al "Quasi-primitive block-wise concatenated BCH codes with collaborative decoding for NAND flash memories" IEEE (ITW), Nov. 2014, pp. 611-615.

Dong et al "On the use of soft-decision errore-correction codes in NAND flash memory," IEEE Transactions on Circuits and Systems I: Regular Papers, vol. 58, No. 2 Feb. 2011.

Zhao et al "LDPC-inSSD:making advanced error correction codes work effectively in solid state drives" 11th USENIX Conf. 2013 Online Available https://www.usenix.org/conference.

Wang et al "Enhanced precision through multiple reads for LDPC decoding in flash memories," IEEE Journal on Selected Areas on communications, vol. 32, No. 5 pp. 880-891, May 2014.

Lin "a low power and ultrahigh reliability LDPC error correction engine with digital signal processing for embedded NAND flash controller in 40nm COMS" Symp on VLSI cir. Jun. 2014.

Haymaker et al "structured bit-interleaved LDPC codes for MLC flash memory" IEEE journal on slected areas in communications, vol. 32, No. 5 May 2014.

JESD218 Solid-state drive requirmements and endurance test method(JESD218) JEDEC Solid state technology asscocation, 2010 (abstract).

Li et al "Improving multi-level NAND flash memory storage relizbility using concatenated BCH-TCM coding" IEEE Transactions on VLSI systems, vol. 18, No. 10, Oct. 2010.

Qi et al "Optimal voltage signal sensing of NAND flash memory for LDPC code." in Signal Processing Systems 2014 IEEE workshop on Oct. 2014 pp. 1-6.

Massey "Variable-Length codes and the fano metric," IEEE Transactions on information theory, vol. 18 No. 1 pp. 196-198 1972.

Sorokine et al "A sequential decoder for linear block codes with a variable bias-term metric," IEEE Transactions on Information Theory, vol. 44, No. 1 pp. 410-416.

Spinner et al "Design and implementaion of a pipelined decoder for generalized concatenated codes," Proceedings of 27th SBCCI, Aracaju, Brazil, Sep. 2014.

(56) References Cited

OTHER PUBLICATIONS

Welburn et al "Improved Performance of reed-solomon decoding wiht the use of pilot signals for erasure generation" VTC 1998 48th IEEE, vol. 3 May 1998.
Yang et al "Product code schemes for error correction in MLC NAND flash memories" IEEE transactions on VLSI Systems, vol. 20, No. 12, Dec. 2012.
Oh et al "RS-Enhanced TCM for mulitlevel flash memories" IEEE transactions on communications, vol. 61, No. 5, May 2013.
Yaakobi et al "Error characterization and coding shemes for flash memories" IEEE Globecom Workshops, Dec. 2010 pp. 1856-1860.
Yaakobi et al "Characterization and error-correcting codes for TLC flash memories" 2012 international conference on computing, networking and communications, Jan. 2012.
Gabrys et al "Graded bit-error-correcting codes with applicaitons for flash memory" IEEE Transactions on Information Theory, vol. 59, No. 4 Apr. 2013.
Gabrys et al "Coding for unreliable flahs memory cells," IEEE communications letters, vol. 18, No. 9 Sep. 2014.

\* cited by examiner (a)

(b)

(c)

METHODS AND DECODER FOR SOFT INPUT DECODING OF GENERALIZED CONCATENATED CODES

CROSS REFERENCE TO RELATED APPLICATION

The present application claims priority to (i.e., is a divisional or continuation of) U.S. patent application Ser. No. 15/594,830 entitled "METHODS AND DECODER FOR SOFT INPUT DECODING OF GENERALIZED CONCATENATED CODES", and filed May 15, 2017 by Freudenberger et al. The entirety of the aforementioned application is incorporated herein by reference for all purposes.

FIELD OF THE INVENTION

The present invention relates to the field of error correction decoding (ECC), in particular for applications in non-volatile memories, such as flash memories.

BACKGROUND

Error correction coding (ECC) based on GC codes has a high potential for various applications in data communication and data storage systems, e.g., for digital magnetic storage systems [1] (see list of references [ ... ] provided below), for non-volatile flash memories [2], and for two-dimensional bar codes [3]. GC codes are typically constructed from inner nested binary Bose-Chaudhuri-Hocquenghem (BCH) codes and outer Reed-Solomon (RS) codes [4], [5], [6]. With algebraic decoding, GC codes have a low decoding complexity compared to long BCH codes. Such codes are well suited for fast hardware decoding architectures [7]. In coding theory, the BCH codes form a class of linear cyclic error-correcting codes that are constructed using finite fields (Galois Fields, GF) while the RS codes belong to the class of non-binary cyclic error-correcting codes and are based on univariate polynomials over finite fields (i.e. GF).

A codeword of a GC code can be considered as a matrix. For encoding, the information is stored in the matrix. In the first encoding step the rows of the matrix are protected by block codes (the outer codes) over the Galois field $GF(2^m)$, wherein m>0 is a positive integer. Next, each column is protected by binary codes, the inner codes. Typically, binary BCH codes are used as inner codes and RS codes as outer codes [8].

Flash memories, particularly NAND flash memories, are important components in embedded systems as well as in consumer electronics. Flash memories require ECC to ensure data integrity and reliability for the user data (cf. [8]). With many flash technologies, the statistic model of the errors can be assumed to be a binary symmetric channel (BSC). Hence, typically BCH codes are used for error correction. Flash memories typically reserve a spare memory area that is used to store the redundancy required for the ECC. This spare area determines the code rate of the error correction code. GC codes have a low decoding complexity compared to long BCH codes.

A decoder processes the potentially erroneous data in multiple decoding steps. In [7] algebraic decoding is used in each decoding step. This is adequate, if the channel provides no soft information about the transmitted or stored bits. However, if the channel does provide reliability information, e.g., if it is known, that it may behave, at least substantially, like an Additive White Gaussian Noise (AWGN) channel, this known soft information may be exploited by the decoder. In the case of GC codes, it is sufficient to exploit the soft information to decode the inner codes. In [7] a pipelined decoder architecture for GC codes was proposed, which is based on algebraic hard input decoding of the component codes. There exist numerous soft input decoding algorithms for binary block codes (see [5] for an overview). For instance, reliability-based decoding algorithms like Chase decoding [9], [10], ordered statistic decoding [11], and the Dorsch algorithm [12], [13], [14], just to name a few. Such algorithms can offer a performance that is similar to that of maximum-likelihood (ML) decoding, but usually they do not guarantee success in finding the ML codeword. However, many of these methods are not suitable for a fast hardware implementation. Furthermore, many channels with quantized output provide only a small number of decision thresholds and hence only 2 or 3 bits of soft information per code bit which is not sufficient for many reliability-based decoding algorithms.

A sequential stack decoding approach has been proposed in [15]. Sequential decoding has a low computational complexity, if the noise level is small. This is the case for many applications of GC codes, e.g., for error correction coding in storage systems. Sequential decoding was originally introduced for tree codes. In order to decode binary block codes, the syndrome trellis may be used as a representation of the code [16]. However, for block codes, the number of trellis states grows exponentially with the number of redundancy bits. Hence, the trellis-based sequential decoding as proposed in [15] is only feasible for codes with low error correcting capabilities.

Traditionally, a binary symmetric channel (BSC) is used as channel model for flash memories and BCH codes are used for error correction [20], [21], [22], [23]. Recently, for NAND flash memories, concatenated codes were proposed that are constructed from long BCH codes [24], [25]. These codes can achieve low residual error rates, but require very long codes and hence a long decoding latency, which might not be acceptable for all applications of flash memories.

The performance of error correction coding can be improved if reliability information about the state of the cell is available [26]. In this case, the channel can be considered as binary input additive white Gaussian noise (AWGN) channel, where the channel output is quantized using a small number of bits [24]. In order to exploit the reliability information, soft input decoding algorithms are required. For instance, low-density parity-check (LDPC) codes can provide stronger error correcting performance in NAND flash memories [27], [28], [29], [30]. However, LDPC codes have high residual error rates (i.e., the error floor) and are not suitable for applications that require very low decoder failure probabilities [2]. For instance, the JEDEC standard for Solid-State Drive (SSD) recommends an uncorrectable bit error rate of less than $10^{-15}$ for client applications and of less than $10^{-16}$ for enterprise solutions [31]. For some applications, block error rates less than $10^{-16}$ are required [32].

SUMMARY OF THE INVENTION

It is an object of the present invention to improve the efficiency of decoding GCC-encoded data. Specifically, it is an object of the invention to provide a method and a decoder for enabling an efficient, particularly space-efficient implementation of a decoder for decoding GCC-encoded data, wherein the decoder is suited for applications that require very low residual error rates, e.g., bit error rate of less than $10^{-15}$ or even less than $10^{-16}$.

A solution to this problem is provided by the teaching of the independent claims. Various preferred embodiments of the present invention are provided by the teachings of the dependent claims.

A first aspect of the invention is directed to a soft input decoding method for a generalized concatenated code, GCC, wherein the GCC is constructed from L inner nested linear binary block codes B( . . . ), preferably binary extended Bose-Chaudhuri-Hocquenghem, BCH, codes, and L outer codes—preferably block codes such as Reed-Solomon, RS, codes—wherein L≥2 denotes the number of levels of the GCC and the inner code of a higher level is a sub-code of the inner code of the preceding lower levels, if any. The method uses one or more decoding devices, i.e. decoders, to iteratively decode level by level original data received from a data channel, e.g., a non-volatile memory device such as flash memory.

For each level the method comprises the following steps:
(i) a first decoding step for decoding input data of the current level based on the inner block codes of the current level and providing respective decoded output data, the input data of the lowest level comprising said original data and the input data of each subsequent level being based on the decoding result of the previous level; and
(ii) a subsequent second decoding step for decoding the outer code of the current level l based on the output data of the first decoding step to estimate a decoding result of the current level l, wherein the decoding result of the highest level is output as decoded data.

Herein, the first decoding step of at least one current level l other than the lowest level comprises trellis-based sequential stack decoding of the input data of the current level l using as a soft input information characterizing the reliability of the data channel. The sequential stack decoding is based on a first trellis representing a first supercode $B_1^{(l)}$ of the inner block code $B^{(l)}$ of the current level l and on a second trellis representing a second supercode $B_2^{(l)}$ of $B^{(l)}$, with $B^{(l)} = B_1^{(l)} \cap B_2^{(l)}$, wherein a supercode of $B^{(l)}$ is a code containing all codewords of $B^{(l)}$ and the redundancy of each of the first supercode $B_1^{(l)}$ and the second supercode $B_2^{(l)}$ is lower than that of $B^{(l)}$. The corresponding inner code $B^{(l-1)}$ of the immediately preceding level l-1 is reused as one of the supercodes $B_1^{(l)}$ and $B_2^{(l)}$. The sequential stack decoding is configured to deliver only codewords comprised in the output data of the first decoding step that are represented by both the first trellis and the second trellis.

The term "extended BCH code", as used herein, refers to a code the codewords of which generally comprise both a BCH codeword and an additional single parity check (SPC) symbol (i.e. a parity bit, if the SPC symbol is only a single bit). However, even a mere SPC-code (without further BCH parity symbols) is already an extended BCH code, in fact it is its simplest form. While a BCH code (that is not a mere SPC code) enables correction of a certain number of errors in a codeword at the decoding side, an SPC code only enables detecting certain errors, specifically if there is an odd number of errors in the codeword.

The term "sub-code" of a particular (parent) code, as used herein, refers to a code consisting of a strict subset of the codewords of said (parent) code. Thus, a code $B^{(n)}$ is a subset of another code $B^{(m)}$, if the set of the codewords of $B^{(n)}$ is a strict subset of the set of codewords of $B^{(m)}$. Specifically, the sub-code may be the code of a particular nesting level of the nested structure of the inner nested block codes, which sub-code is a subset of a lower-level block code of the nested structure. Accordingly, in the nested structure $$B^{(L-1)} \subseteq B^{(L-2)} \subseteq \ldots \subseteq B^{(0)}$$

the block code $B^{(L-q)}$ with L>q>0 and q being an integer is a sub-code of at least the block code $B^{(0)}$ of the lowest nesting level 0 and, if q<L−1, of any higher nested block code defined between $B^{(0)}$ and $B^{(L-q)}$ in the nested structure.

The term "soft input decoding" in the sense of the present invention refers to a way of decoding original data received from a channel, wherein information characterizing the reliability of the channel is taken into account by an algorithm used to perform the decoding as input variable(s) to the algorithm.

The term "trellis" refers to a representation of a code, wherein a trellis T=(S, W) is a labeled, directed graph, where W={w} denotes the set of all branches in the graph and S={σ} is the set of all nodes. The set S is decomposed into n+1 disjoint subsets $S = S_0 \cup S_1 \cup \ldots \cup S_n$ that are called "levels" of the trellis. Similarly, there exists a partition of the set $W = W_1 \cup W_2 \cup \ldots \cup W_n$. A node $\sigma \in S_t$ of the level t may be connected to a node $\tilde{\sigma} \in S_{t+1}$ of the level t+1 by one or several branches. Each branch $w_t$ is directed from a node σ of level t−1 to a node $\tilde{\sigma}$ of the next level t. Herein, it is assumed that the end levels have only one node, namely $S_0 = \{\sigma_0\}$ and $S_n = \{\sigma_n\}$. A trellis is a compact method of presenting all codewords of a code. Each branch of the trellis $w_t$ is labeled by a code symbol $v_t(w_t)$. Each distinct codeword corresponds to a distinct path in the trellis, i.e., there is a one-to-one correspondence between each codeword v in the code and a path w in the trellis: $v(w) = v_1(w_1), \ldots, v_n(w_n)$.

Herein, code sequence segments and path segments are denoted by $v_{[i,j]} = v_i, \ldots, v_j$ and $w_{[i,j]} = w_i, \ldots, w_j$, respectively. The so-called "syndrome trellis", can be obtained using its parity-check matrix [16]. The syndrome trellis is minimal inasmuch as this trellis has the minimal possible number of nodes /S/ among all possible trellis representations of the same code.

The term "trellis-based sequential stack decoding" refers to a stack algorithm, i.e. an iterative decoding method, such as the one presented in [15], wherein a stack is required to store interim results. The stack contains code sequences of different lengths. Let $v_t$ denote a code sequence of length t, i.e., $v_t = v_1, \ldots, v_t$. Each code sequence is associated with a metric and a node $\sigma_t$. The node $\sigma_t$ is the node in the trellis that is reached, if one follows the path corresponding to the code sequence through the trellis. In each iteration, the metric rates each code sequence and the stack is ordered according to these metric values where the code sequence at the top of the stack is the one with the largest metric value. The code sequence corresponding to the top path of the stack in the final iteration represents the estimated codeword. A more detailed explanation of trellis-based sequential stack decoding will be discussed below with reference to FIGS. 3 to 8 based on specific simple exemplary codes. Herein trellis-based sequential stack decoding is used to decode the inner block codes of the overall GCC on a given current level of the GCC, wherein the decoding is performed level by level.

Generally, the amount of memory space a trellis-based decoder needs for storing a trellis depends on the number of nodes in the trellis. For example, each node may require at least memory space for storing two addresses corresponding to two different pointers to nodes in the subsequent level of the trellis. Furthermore, the maximum number of nodes at a given depth of the trellis is equal to the number of redundancy bits, i.e. parity bits, of the code. Accordingly, a code of length n and dimension k and thus (n−k) redundancy bits, requires a maximum number of $n*2^{(n-k)}$ nodes and sufficient memory space to store the respective trellis. Based on the above example with two pointers per node this results in a total of $2n*2^{(n-k)}$ pointers.

As in the GCC discussed herein the number of redundancy bits increases from level to level, the required storage space drastically grows with each additional (higher) level and thus the space efficiency of a respective decoder will decrease accordingly the more levels and redundancy bits are used in the code.

The solution according to its first aspect of the present invention mitigates this growing space inefficiency by using the concept of supercodes, wherein an inner code $B^{(l)}$ of a current level is represented by an intersection=$B_1^{(l)} \cap B_2^{(l)}$ of two supercodes $B_1^{(l)}$ and $B_2^{(l)}$. Each of the supercodes has a lower number of redundancy bits than the inner code $B^{(l)}$ of the current level and thus fewer trellis nodes to be stored. The concept of supercode decoding is well suited for decoding of GC codes, because due to the construction of the GC codes, where a lower-level inner code is always a supercode of each subsequent higher inner code, the concept of reusing already stored sub-codes of the previous lower levels as supercodes for decoding subsequent higher levels provides a significant saving of memory space and thus an increased space efficiency. A numerical example demonstrating this storage saving effect will be provided below in the Detailed Description of the Invention section.

A second aspect of the present invention is also directed to a soft input decoding method for a generalized concatenated code, GCC, wherein the GCC is constructed from L inner nested linear binary block codes $B^{(\cdots)}$, preferably binary extended Bose-Chaudhuri-Hocquenghem, BCH, codes, and L outer codes—preferably block codes such as Reed-Solomon, RS, codes—wherein L≥2 denotes the number of levels of the GCC and the inner code of a higher level is a sub-code of the inner code of the preceding lower levels, if any. The method uses one or more decoding devices, i.e. decoders, to iteratively decode level by level original data received from a data channel, e.g. a non-volatile memory device such as flash memory.

For each level the method comprises the following steps:

(i) a first decoding step for decoding input data of the current level l based on the inner block codes of the current level l and providing respective decoded output data, the input data of the lowest level comprising the original data and the input data of each subsequent level being based on the decoding result of the previous level; and (ii) a subsequent second decoding step for decoding the outer code of the current level l based on the output data of the first decoding step to estimate a decoding result of the current level l, wherein the decoding result of the highest level is output as decoded data.

Herein the first decoding step of at least one of the levels comprises: (a) sequential stack decoding of the input data of the current level l based on a trellis of the inner block code of the current level land using as a soft input information characterizing the reliability of the data channel, wherein the sequential stack decoding is configured to deliver only codewords comprised in the output data of that first decoding step which are represented by the trellis; and (b) selecting as the output data of the first decoding step of the current level l: (1) a first output data estimate resulting from the sequential stack decoding of the input data of the current level, if its metric value rated according to a predetermined metric reaches or exceeds a predetermined threshold or is superior according to the metric to the respective metric value of a second output data estimate resulting from a second run of the sequential stack decoding in which the first output data estimate is excluded, and (2) the second output data estimate otherwise.

The method according to the second aspect of the present invention relates to so-called "list decoding", particularly "list-of-two decoding", which is an alternative to unique decoding of error-correcting codes for large error rates. While unique decoding provides only a single result, e.g. a single codeword, as a decoding result, the main idea behind list decoding is that the decoding algorithm instead of outputting a single possible result (e.g. codeword) outputs a list of possible results one of which is correct, or at least a preferred estimate. This allows for handling a greater number of errors than that allowed by unique decoding. In the case of list-of-two-decoding the list of possible results is limited to two results. The specific form of list-of-two-decoding as provided according to the second aspect of the present invention may be denoted as "Sequential list-of-two (stack) decoding".

In order to enable a trade-off between performance and complexity, the method introduces a threshold ρ for the metric of the estimated codeword, which enables a reduction of the residual word error rate compared to similar unique coding algorithms having a similar complexity and thus also allows for the use of higher code rates at a similar error rate. The use of combining sequential stack decoding of GCCs with List-of-two decoding is motivated by the fact that the method according to the first aspect of the present invention is not a maximum-likelihood decoding procedure. Hence, searching for further codewords in order to find even better codeword candidates is justified, particularly in applications, where very low residual error rates or very high code rates need to be achieved. This may particularly apply to decoding of data read from channel comprising a non-volatile memory, such as flash memory, particularly if such memory is used in connection with applications related to security, safety or critical infrastructure.

According to a preferred embodiment of the method of the second aspect, the first decoding step of at least one current level l other than the lowest level comprises trellis-based sequential stack decoding of the input data of the current level l using as a soft input information characterizing the reliability of the data channel. The sequential stack decoding is based on a first trellis representing a first supercode $B_1^{(l)}$ of the inner block code $B^{(l)}$ of the current level l and on a second trellis representing a second supercode $B_2^{(l)}$ of $B^{(l)}$, with $B^{(l)}=B_1^{(l)} \cap B_2^{(l)}$, wherein a supercode of $B^{(l)}$ is a code containing all codewords of $B^{(l)}$ and the redundancy of each of the first supercode $B_1^{(l)}$ and the second supercode $B_2^{(l)}$ is lower than that of $B^{(l)}$. The corresponding inner code $B^{(l-1)}$ of the immediately preceding level l−1 is reused as one of the supercodes $B_1^{(l)}$ and $B_2^{(l)}$. Furthermore, the sequential stack decoding is configured to deliver only codewords comprised in the output data of the first decoding step that are represented by both the first trellis and the second trellis.

In this way, the advantages of both using super codes for increasing space efficiency and using list-of-two-decoding for enhancing the available code rate and/or reducing the residual error rates can be combined and realized.

In the following, preferred embodiments of the methods according to the first and second aspects of the present invention are described, which can be arbitrarily combined with each other or with other aspects of the present invention, unless such combination is explicitly excluded or technically impossible.

According to a preferred embodiment, the method further comprises applying hard decoding to decode the inner block codes in the first decoding step of a first level of the GCC, the first level being preferably the lowest level, before applying sequential stack decoding to a higher level based on a trellis of the inner block code of the higher level and using as a soft input information characterizing the reliability of the data channel. This allows for a reduction of complexity for the decoding of the inner codes of said first level compared to soft input decoding and thus for faster processing times.

In a preferred variant hereof, the first decoding step comprises determining for at least one data word comprised in the input data of the current level, whether the codeword resulting from hard decision decoding of the data word corresponds to a valid codeword of the inner block code B of the current level. In this way, the soft input decoding and its related processing time and effort can be omitted in cases, where the hard decision decoding of a received word in the input data of the first level (particularly in the original data, if the first level is the lowest level) corresponds to a valid codeword of the respective inner code of said level. Furthermore, as will be shown in the "Detailed Description" section below, if the word in the input data corresponds to a valid codeword, this codeword actually represents the maximum-likelihood estimate and thus already an optimal decoding result for said inner block code.

According to a further preferred embodiment the metric that is applied in the sequential stack decoding to rate code sequences occurring during the decoding and to order the stack based on the metric values resulting from the rating is one of the Fanometric and the quadratic Euclidean distance metric, or a combination thereof. Furthermore, the soft input characterizing the reliability of the data channel serves as an input variable of the metric.

The Fano metric is defined as follows. Let vi be the i-th code bit and $r_i$ the i-th received symbol for transmission over a discrete memory less channel. The Fano metric for a code bit $v_i$ is defined by:

$$M(r_i|v_i) = \log_2 \frac{p(r_i|v_i)}{p(r_i)} - \mathcal{B}$$

where $p(r_i|v_i)$ is the channel transition probability and $p(r_i)$ is the probability to observer $r_i$ at the channel output. The term $\mathcal{B}$ is a biasterm that is typically chosen to be the code rate R[34]. The Fano metric of a code sequence $v_t$ is $$M(r_t|v_t) = \sum_{i=1}^{t} M(r_i|v_i)$$

where $r_t$ is the sequence of the first received symbols. Note that the Fano metric according to the above equations is only defined for discrete memory less channels (DMC). We consider the quantized AWGN channel which is a DMC. Binary block codes typically have no tree structure. Consequently, the Fano metric is not necessarily the best metric for all binary block codes. For instance, in [35] a metric with variable bias term was proposed for linear block codes. However, in particular at least when the inner block codes are specifically selected to be binary BCH codes, $\mathcal{B}=R$, provide good results for all considered channel conditions.

The quadratic Euclidean distance metric is defined as: $d_E^2(x,r)=\Sigma_{i=1}^n |x_i-r_i|^2$ wherein the transmitted symbol vector x is distorted by a noise vector n such that the received sequence, i.e. the original data received from the channel, is r=x+n. A selection of the quadratic Euclidean distance metric as the metric used in connection with the present decoding method is particularly useful, if the channel can be considered an AWGN channel.

According to a further preferred embodiment the block code of the lowest level of the inner nested block codes is a single-error correction code, i.e. a code the error correction capability of which is limited to correcting a single error in a received data word to be decoded. This enables a particularly time and space-efficient implementation, because the total number of redundancy bits used in the GCC for the inner blocks can thus be minimized which effects both the processing time for the decoding algorithm and the memory space needed, in particular for the storage of the involved trellises.

According to a further preferred embodiment the inner codes are nested binary extended Bose-Chaudhuri-Hocquenghem, BCH, codes, and the extended BCH code in the lowest level of the inner nested BCH codes is a mere single parity-check, SPC, code. Furthermore, the extended BCH code in at least one higher level of the inner nested BCH codes has an error correction capability and is a sub-code of the BCH code of the lowest nesting level. BCH codes are linear binary block codes which are a particularly suitable selection for the inner codes of said GCC. While the code constructions where also the inner block codes of the lowest level have an error correction capability are typically limited to codes with an overall code rate of less than or equal to 0.9, which is not applicable in flash memories that provide only a small spare memory area for storing the redundancy required for the ECC, the encoding method according to this embodiment enables high rate GC codes with code rates above 0.9. Accordingly, such high rate GC codes can be used to encode data to be stored in memories, esp. flash memories, which provide only a small spare memory area. Despite the use of only SPC instead of higher BCH codes in the lowest nesting level, similar ECC error correction levels can be achieved and thus the efficiency (code rate) of the code can be increased. In other words, the efficiency of such memories in terms of their storage capacity for user data can be improved due to the increased code rate. Further variants and improvements to this embodiment are provided in DE 10 2017107431.7 of the same applicant, the disclosure of which is herewith incorporated in its entirety by reference.

According to a further preferred embodiment the original data received from a data channel is arranged in a two-dimensional original data matrix having a first dimension $n_a$ equal to the length of the outer codes and a second dimension $n_b$ equal to the length of the inner block codes, wherein a line of the first dimension of a matrix is a row of the matrix and a line of its second dimension is a column of the matrix, or vice versa. The outer codes are defined over a Galois-Field GF($2^m$) such that m elements of each line of the second dimension represent one symbol of the Galois-Field GF($2^m$). Furthermore:

a) A first iteration corresponding to the lowest level of the inner block codes of the original data matrix, wherein the first decoding step comprises:
   applying a decoding scheme of the inner block code of the lowest level to the lines of the second dimension of the original data matrix with respect to the lowest level of the inner nested block codes in which the lines of a second dimension of the original data matrix are encoded in order to obtain an intermediate decoding data matrix of the first iteration and to determine erasure information characterizing lines of the second dimension of the original data matrix in which an erasure has been detected based on the decoding of the inner block code of the lowest level;

inferring the information bits contained in the lines of the second dimension of the intermediate decoding data matrix of the first iteration in order to retrieve code symbols of the outer codes in which the lines of a first dimension of the original data matrix are encoded; and the second decoding step comprises:

applying outer decoding corresponding to the respective outer codes to the retrieved code symbols in the lines of the first dimension of the intermediate decoding data matrix of the first iteration in order to obtain a partial decoding result matrix of the first iteration, wherein the erasure information is used during outer decoding to identify erroneous symbols of the outer code in the intermediate decoding data matrix of the first iteration;

re-encoding said partial decoding result matrix of the first iteration by applying an encoding scheme of the inner block code of the lowest level to the second dimension of this matrix to obtain a re-encoded matrix of the first iteration; and subtracting the re-encoded matrix of the first iteration from the original data matrix in order to obtain a start matrix for a subsequent further iteration; and b) for each of the further levels of the inner block codes, a respective further iteration wherein the first decoding step of the respective level comprises:

applying a decoding scheme of the inner block code of the current level to the lines of the second dimension of the start matrix of the current iteration with respect to the current level of the inner block codes in which the lines of a second dimension of the start matrix of the current iteration are encoded in order to obtain an intermediate decoding data matrix of the current iteration;

inferring the information bits contained in the lines of the second dimension of the intermediate decoding data matrix of the current iteration in order to retrieve code symbols of the outer codes in which the lines of a first dimension of the original data matrix are encoded;

applying outer decoding corresponding to the respective outer codes used for obtaining the original data matrix during encoding, to the retrieved code symbols in the lines of the first dimension of the intermediate decoding data matrix of the current iteration in order to obtain a partial decoding result matrix of the current iteration;

if the current iteration corresponds to the highest nesting level of the inner block codes in the original data matrix, outputting the partial decoding result matrix of the current iteration as the decoded data, and otherwise, re-encoding said partial decoding result matrix of the current iteration by applying an encoding scheme of the inner block code of the current level to the second dimension of this matrix to obtain a re-encoded matrix of the current iteration, and subtracting the re-encoded matrix of the current iteration from the start matrix of the current iteration in order to obtain a start matrix for a subsequent further iteration.

In this way, a particularly time-efficient implementation of the decoding methods of the first and second aspect can be achieved, wherein the matrix representation is used to provide a suitable structure based on which the individual process steps of the method are performed.

According to a further preferred embodiment in at least one, preferably each, first decoding step using sequential stack decoding, the decoding of a data word in the input data of the inner code of the current level is terminated, when: (i) the maximum possible path length is reached, wherein the trellis path having the best metric value among the paths accrued so far in the stack is selected as the decoded codeword corresponding to the data word; or (ii) a predetermined maximum number of iterations have occurred. While case (i) corresponds to the regular completion of the decoding algorithm, case (ii) can be used to terminate a failed decoding run and thus avoid a loss of time due to a decoding failure that would otherwise cause further decoding cycles to be performed without merit.

Specifically, in a preferred variant, if the termination is caused because a predetermined maximum number of iterations have occurred, the output data of the current first decoding step is marked as an erasure symbol for the corresponding outer code used in the second decoding step of the current level. This enables the employment of both error and erasure decoding of the outer codes, whether the decoding failures of the inner codes are regarded as erased symbols of the outer code, e.g. outer RS code.

A third aspect of the present invention is directed to a decoding device adapted to perform the decoding method of the first and/or the second aspect of the present invention, particularly including any one or more of its preferred embodiments described herein.

According to a preferred embodiment, the device comprises a plurality of distinct memories or memory areas, preferably of the read-only memory (ROM) type, which can be simultaneously accessed and each of which is configured to store a data representation of a trellis used in the decoding method. In this way, a parallel access to the various memories or memory areas, particularly for reading data representing the various trellises involved in the decoding, is enabled, which supports even faster processing time and thus may be used to at least partially compensate the additional time consumed by soft input decoding and/or list-of-two decoding in comparison to simple hard and/or unique decoding. Choosing ROM memory to store data representations of the trellis is particularly advantageous because of its typically very high memory density. This can be used to further increase the space efficiency of the decoding device respectively a memory system comprising same as well as related memory devices.

A fourth aspect of the present invention is directed to a nonvolatile memory system comprising (i) a memory array including a plurality of cells configured to store a plurality of data bits and a plurality of parity bits that are calculated from the plurality of data bits according to a coding scheme based on generalized concatenated code, GCC, wherein the GCC is constructed from inner nested linear binary block codes, preferably binary extended Bose-Chaudhuri-Hocquenghem, BCH, codes, and outer codes, preferably Reed-Solomon, RS, codes; and (ii) a decoding device according the third aspect of the present invention or any one or more of its preferred embodiments described herein, the decoding device being configured to receive and decode GCC-coded original data from the memory array.

Finally, a fifth aspect of the present invention is directed to a computer program, or to a computer program product, comprising instructions, which when executed on one or more processors of a decoding device, e.g. according to the third aspect of the invention, cause the decoding device to perform the method of the first and/or the second aspect of the present invention, particularly including any one or more of its preferred embodiments described herein.

The computer program product may in particular be implemented in the form of a data carrier on which one or more programs for performing the method are stored. Preferably, this is a data carrier, such as a CD, a DVD or a flash memory module. This may be advantageous, if the computer program product is meant to be traded as an individual product independent from the processor platform on which the one or more programs are to be executed. In another implementation, the computer program product is provided as a file on a data processing unit, in particular on a server, and can be downloaded via a data connection, e.g. the Internet or a dedicated data connection, such as a proprietary or local area network.

The advantages and benefits described herein in connection with the methods of the first and second aspects of the present invention apply mutatis mutandis to its further aspects.

BRIEF DESCRIPTION OF THE DRAWINGS

Further advantages, features and applications of the present invention are provided in the following detailed description and the appended figures, wherein.

DETAILED DESCRIPTION

I. GC Construction

The coding methods illustrated herein are based on the use of GC codes for error correction in memories, such as flash memories, that require high-rate codes. The GC codes are constructed from inner nested binary Bose-Chaudhuri-Hocquenghem (BCH) codes and outer Reed-Solomon (RS) codes. For the inner codes extended BCH codes are used, where single parity-check codes are applied in the first level of the GC code (cf. FIGS. 1 and 2). This construction enables high-rate GC codes. A detailed general discussion of GC codes can be found in [5].

Figure 1:
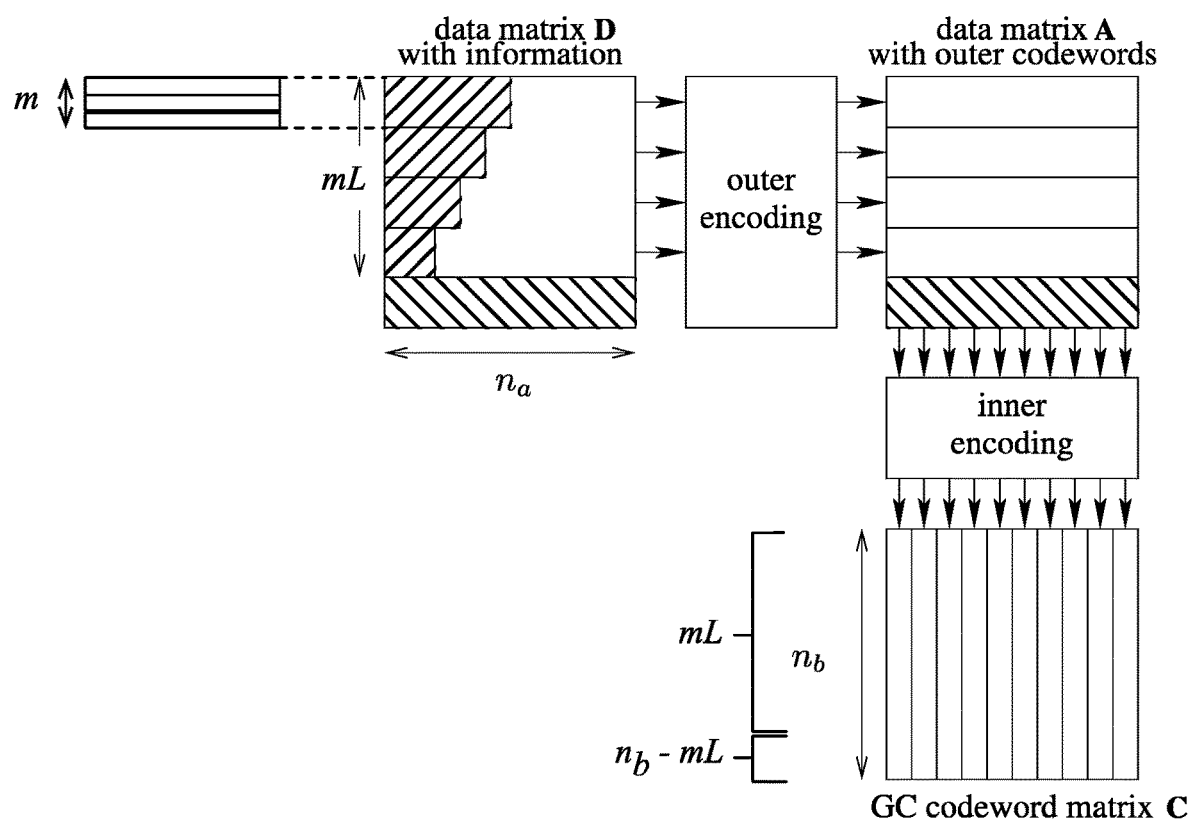
FIG. 1 schematically illustrates a construction of a GC code starting from original data arranged in a data matrix to be encoded into a corresponding codeword matrix, according to a preferred embodiment of the present invention.

Reference is now made to FIG. 1, which illustrates a construction of a GC code starting from original data arranged in a data matrix to be encoded into a corresponding codeword matrix, i.e. an encoding process leading to a GC code that is suitable to be decoded by decoding methods and devices according to the present invention. The original data is arranged in an $n_b \times n_a$ matrix, where $n_a$ and $n_b$ are the lengths of the outer and inner codes, respectively. The encoding starts with the outer codes. The rows are protected by L outer codes, e.g. Reed-Solomon codes, of length $n_a$, i.e. L denotes the number of levels. m elements of each column represent one symbol from the Galois field $GF(2^m)$. Hence, m neighboring rows form a codeword of an outer code $A^{(i)}$, i=0, ..., L-1. Note that the code rate of the outer codes increases from level to level. The outer codes protect Lm rows of the matrix. The remaining $n_b$-Lm rows are used for the redundancy of the inner codes.

The shaded area in FIG. 1 illustrates the redundancy of the component codes that are filled by outer and inner encoding. After the outer encoding the columns of the codeword matrix are encoded with binary inner codes of length $n_b$. Each column of the codeword matrix is the sum of L codewords of nested linear BCH codes.

$$B^{(L-1)} \subseteq B^{(L-2)} \subseteq \ldots B^{(0)} \quad (1)$$

Hence, a higher level code is a sub-code of its predecessor, wherein the higher levels have higher error correcting capabilities, i.e., $t_{b,L-1} \geq t_{b,L-2} \geq \ldots t_{b,0}$, where $t_{b,i}$ is the error correcting capability of level i. The code dimensions are $k^{(0)}=Lm$, $k^{(1)}=(L-1)m$, ..., $k^{(L-1)}=m$. The codeword $b_j$ of the j-th column is the sum of L codewords.

$$b_j = \sum_{i=0}^{L-1} b_j^{(i)} \quad (2)$$

These codewords $b_j^{(i)}$ are formed by encoding the symbols $a_{j,i}$ with the corresponding sub-code $B^{(i)}$, where $a_{j,i}$ is the j-th symbol (m bits) of the outer code $A^{(i)}$. For this encoding (L−i−1)m zero bits are prefixed onto the symbol $a_{j,i}$. Note that the j-th column $b_j$ is a codeword of $B^{(0)}$, because of the linearity of the nested codes.

Figure 2:
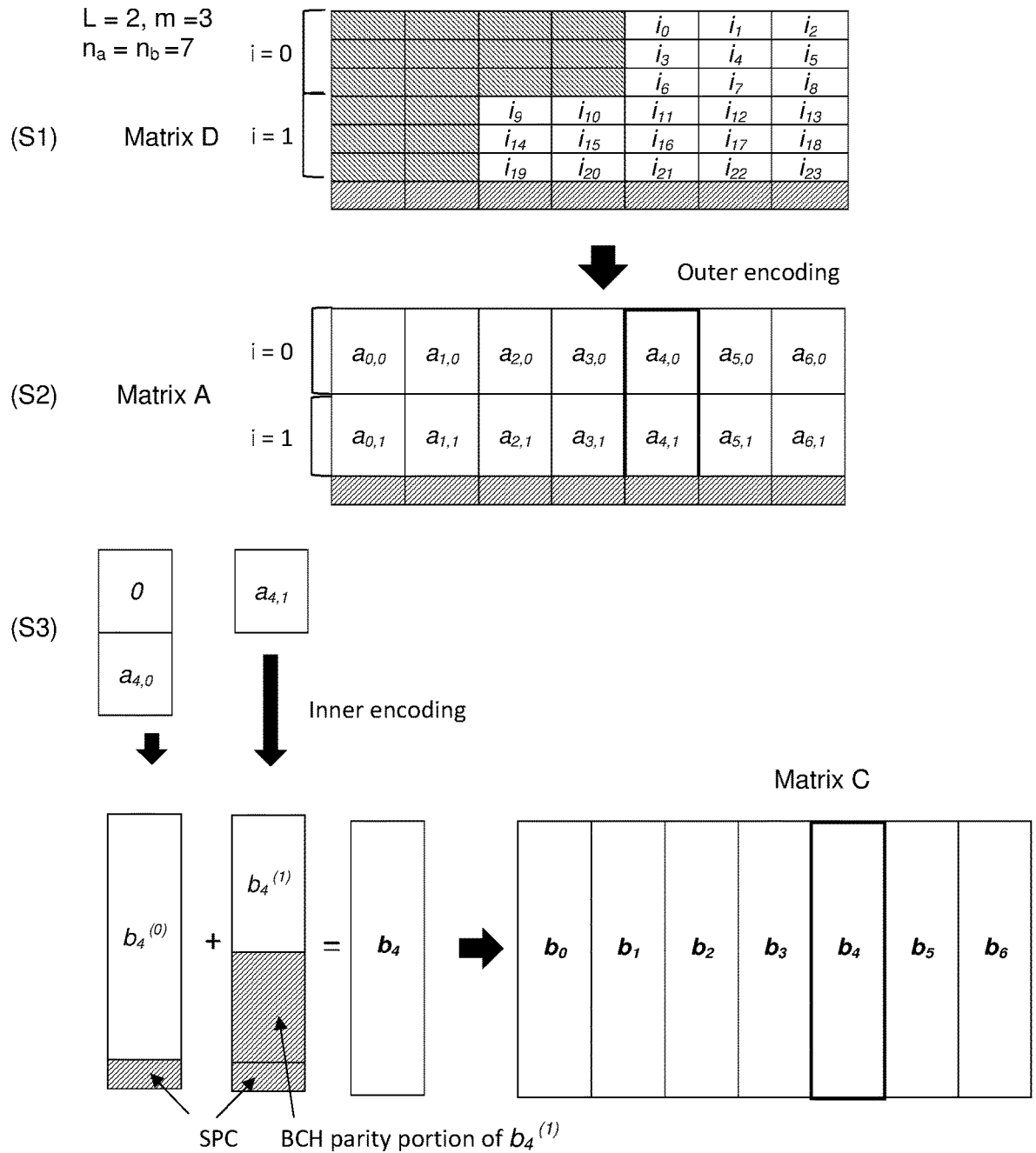
FIG. 2 schematically illustrates a simplified version of the encoding scheme of FIG. 1 in more detail.

FIG. 2 illustrates this encoding scheme in more detail based on a simple exemplary case (Example 0), where L=2, m=3 and $n_a=n_b=7$. Thus, in this example there are only L=2 levels and with $m_1=m=3$ bits per symbol the outer codes, selected to be RS codes in this example, are constructed over the Galois field $GF(2^3)$, while for the sake of simplicity the inner block codes, selected to be extended BCH codes in this example, are defined over $GF(2^3)$, i.e. $m_2=3$. In a first step S1, a data structure representing a $n_b \times n_a$ (i.e. 7×7) matrix D is filled with data to be encoded and consisting of 24 information bits $i_0$ to $i_{23}$. The filling scheme corresponds to that of the data matrix D in FIG. 2. Accordingly, in the first level (i=0) the number of information bits is lower than in the second level (i=1) and the remaining prefixed bits of both levels are reserved for the redundancy added by the outer encoding in a next step S2. Each symbol comprises three neighboring bits of the same column, such that for example in the fifth column of D the bits $i_0$, $i_3$ and $i_6$ form a first symbol in the column, and the bits $i_{11}$, $i_{16}$ and $i_{21}$ form another symbol. In addition, the final row of the matrix D is reserved for redundancy to be added by the inner encoding in a further step S3.

In the outer encoding step S2, the information in each of the two levels i=0 and i=1 is encoded by a respective RS code, wherein the code dimension of the outer RS code for level 0 is only $k_a^{(0)}=3$ while the code dimension of level 1 is increased to $k_a^{(1)}=5$. Performing the outer encoding step S2 results in an intermediate matrix A comprising the code symbols $a_{i,j}$, wherein each of these symbols $a_{i,j}$ comprises $m_1=3$ bits and the rows of the matrix A are codewords of the outer code.

In the inner encoding step S3 each of the symbols $a_{i,j}$ of the intermediate matrix A is individually encoded by a corresponding inner code in the form of an extended BCH code $B^{(i)}$. In the first level i=0, the respective extended BCH code $B^{(0)}$ may particularly be, as in this example, a mere Single Parity Check (SPC) code. Accordingly, as exemplarily illustrated in FIG. 2 for symbol $a_{4,0}$, each of symbols $a_{j,0}$, of level 0 (j=0, . . . , 6) is encoded by prefixing $(L-i-1)m_1$, i.e. (2-0-1)*3=3 zero bits (i.e. a "0" symbol) onto the symbol and applying an SPC code to the two symbols which is added in the final row of the column representing a resulting codeword $b_j^{(0)}$ for column j and level 0.

In the second level i=1, the respective extended BCH code $B^{(1)}$, which unlike the SPC code does have an error correction capability of 1 Bit, is applied in each column of the matrix A to the respective symbol $a_{j,1}$. As in this simple example this is already the final level, no prefixing of "0" symbols is necessary. Again, an SPC code is applied to the resulting BCH codeword and added in the final row of the respective column j.

In order to arrive at the final GC codeword matrix C, on a column by column basis all of the individual codewords $b_j^{(i)}$ of all levels i of column j are added according to formula (2) above in order to receive the corresponding codeword $b_j$ which then forms column j of the resulting GC codeword matrix C, as again exemplarily illustrated in FIG. 2 for column j=4.

In a further example (Example 1) corresponding to FIG. 1, we consider a GC code suitable for error correction in flash memories. The GC code is designed for 2 KB information blocks, i.e. a code which can be used to store 2 KB of data plus additional meta information. For this GC code we use L=6 levels with inner nested BCH codes over GF ($2^6$), i.e. $m_2=6$, and outer RS codes over GF ($2^9$) (i.e. $m_1=9$). In the first level (i=0) the inner code can correct a single error and therefore six redundancy bits are needed. Thus, the number of rows is $n_b=6\cdot9+6=60$. All inner codes are binary BCH codes of length $n_b=60$, where the code $B^{(0)}$ has a dimension $k_{b,0}=54$ and minimum distance $d_{b,0}=3$. The outer RS codes are constructed over the Galois field GF($2^9$). Hence, the dimension of the inner codes is reduced by $m_1=9$ bits with each level. The GC code is constructed from L=6 outer RS codes of length $n_a=343$. The parameters of the codes are summarized in Table I. The code has overall dimension $k=m\Sigma_{j=0}^{L-1}k_{a,j}=16596$ and length $n=n_a\cdot n_b=20580$. The code has a code rate R=0.806. The design of this code will be discussed later-on.

TABLE I

| j | $k_{b,j}$ | $d_{b,j}$ | $k_{a,j}$ | $d_{a,j}$ |
|---|---|---|---|---|
| 0 | 54 | 3 | 187 | 157 |
| 1 | 45 | 5 | 321 | 23 |
| 2 | 36 | 9 | 333 | 11 |
| 3 | 27 | 11 | 331 | 13 |
| 4 | 18 | 15 | 335 | 9 |
| 5 | 9 | 17 | 337 | 7 |

Parameters of the code of example 1.
$k_{b,j}$ and $d_{b,j}$ are the code dimension and minimum Hamming Distance of the binary inner code of level j.
$k_{a,j}$ and $d_{a,j}$ are the code dimension and minimum Hamming Distance of the outer RS codes.

This code is also able to correct burst errors. The minimum distance of all outer RS code is greater than or equal to five. Hence, each outer code can correct at least two erroneous symbols and consequently two columns of the codeword matrix may be corrupted by an arbitrary number of errors.

II. Sequential Stack Decoding

The GC decoder processes level by level, where first the inner codes and then the outer codes are decoded. In order to enable soft input decoding of the overall GC code, a soft input decoding algorithm for the inner codes is required. This section describes sequential decoding procedures using the stack algorithm for block codes. These decoding methods are used to decode the binary inner codes.

A. Sequential Stack Decoding Using a Single Trellis

Firstly, a sequential stack decoding process using a single trellis, as presented in [15], is discussed in more detail with reference to Algorithm 1 outlined below in order to better illustrate a starting point of the present invention. All decoding methods of the present invention are based on this decoding method, which uses a trellis, as defined above, to represent the code. Improvements to this decoding algorithm provided by the present invention will be discussed in the subsequent sections.

The sequential decoding procedure as presented in [15] is a stack algorithm, i.e., a stack is required to store interim results. The stack contains code sequences of different lengths. Let $v_t$ denote a code sequence of length t, i.e. $v_t=v_1, \ldots, v_t$. Each code sequence is associated with a metric and a node $\sigma_t$. The node $\sigma_t$ is the node in the trellis that is reached by following the path corresponding to the code sequence through the trellis. The metric rates each code sequence and the stack is ordered according to these metric values where the code sequence at the top of the stack is the one with the largest metric value.

The Fano metric for a code bit $v_i$ is defined as follows. Let $v_i$ be the i-th code bit and $r_i$ the i-th received symbol for transmission over a discrete memory less channel. The Fano metric for a code bit $v_i$ is defined by:

$$M(r_i|v_i) = \log_2 \frac{p(r_i|v_i)}{p(r_i)} - \mathcal{B} \qquad (3)$$

where $p(r_i|v_i)$ is the channel transition Probability and $p(r_i)$ is the probability to observe r at the channel output. The term $\mathcal{B}$ is a bias term that is typically chosen to be the code rate R [34]. The Fano metric of a code sequence $v_t$ is $$M(r_t|v_t) = \sum_{i=1}^{t} M(r_i|v_i) \qquad (4)$$

where $r_t$ is the sequence of the first t received symbols. Note that the Fano metric according to the above equations is only defined for discrete memory less channels (DMC). We consider the quantized AWGN channel which is a DMC. Binary block codes typically have no tree structure. Consequently, the Fano metric is not necessarily the best metric for all linear block codes. However, in particular at least when the inner block codes are specifically selected to be binary BCH codes, $\mathcal{B}=R$ provides good results for all considered channel conditions.

Algorithm 1 will be demonstrated in the following example (Example 2), where for simplicity a transmission over a binary symmetrical channel (BSC) is assumed:
Consider for instance the code B={(0000),(1110),(1011),(0101)} with parity-check matrix $$H = \begin{pmatrix} 1 & 1 & 0 & 1 \\ 0 & 1 & 1 & 1 \end{pmatrix}.$$

The corresponding trellis is depicted in FIG. 3A. A transmission over a binary symmetrical channel with an error probability of 0.1 is assumed. Hence, the results for the Fano metric are:

$$M(r_i|v_i) \approx \begin{cases} 0.3 \text{ for } r_i = v_i \\ -2.8 \text{ for } r_i \neq v_i \end{cases}.$$

Algorithm 1 can be described in pseudo-code form as follows:

---
Algorithm 1: Sequential stack decoding using a single trellis.
---
Data: received word r
Result: estimated codeword $\hat{v}$
Sequential decoding starts in the first node $\sigma_0$ of the trellis;
calculate the metric values for $v_1 = 0$ and $v_1 = 1$;
insert both paths into the stack according to their metric values;
while the top path has not approached the end node $\sigma_n$ do
   remove the code sequence $v_t$ at the top from the stack;
   if the branch $v_{t+1} = 0$ exists in the trellis for the node $\sigma_t$ corresponding
   to the top path $v_t$ then
      calculate the metric M $(r_{t+1}|v_{t+1}) = M (r_t|v_t) + M (r_{t+1}|v_{t+1} = 0)$;
      insert the code sequence $v_{t+1}= (v_t,0)$. into the stack;
   end
   if the branch $v_{t+1} = 1$ exists in the trellis for the node $\sigma_t$ corresponding
   to the top path $v_t$ then
      calculate the metric M $(r_{t+1}|v_{t+1}) = M (r_t|v_t) + M (r_{t+1}|v_{t+1} = 1)$;
      insert the code sequence $v_{t+1}= (v_t,1)$ into the stack;
   end
end
return the codeword $\hat{v}$ corresponding to the top path in the final iteration;

---

The following table represents the stack for the received sequence r=(0010) throughout the four iterations needed to calculate the estimated codeword $\hat{v}$:

| 1st iteration | | 2nd iteration | | 3rd iteration | | 4th iteration | |
| --- | --- | --- | --- | --- | --- | --- | --- |
| $v_t$ | M $(r_t|v_t)$ | $v_t$ | M $(r_t|v_t)$ | $v_t$ | M $(r_t|v_t)$ | $v_t$ | M $(r_t|v_t)$ |
| 0 | 0.3 | 00 | 0.6 | 000 | -2.2 | 0000 | -1.9 |
| 1 | -2.8 | 01 | -2.5 | 01 | -2.5 | 01 | -2.5 |
|  |  | 1 | -2.8 | 1 | -2.8 | 1 | -2.8 |

Accordingly, the top word after the 4$^{th}$ and last iteration is output as the estimated codeword $\hat{v}$=0000. A negative value indicates that the received word was in error. A positive value indicates that the received word is error free. More errors in the received word lead to a negative value with large magnitude, which indicates a low reliability of the estimated codeword. This indication can then be used by the subsequent decoding of the outer codes to correct the remaining error(s).

B. Supercode Decoding for Nested BCH-Codes

This section starts with a description of the supercode decoding method according to preferred embodiments followed by a discussion of the proposed application of supercode decoding for the nested-BCH codes that are used in the GC code.

A supercode is a superset $B_1$ of the original code $B \subset B_1$. In order to decode the original code B, two supercodes $B_1$ and $B_2$ have to constructed such that $B_1 \cap B_2 = B$. The supercodes have fewer redundancy bits and thus fewer trellis states. The supercodes can be constructed such that each code has half of the original redundancy bits. This reduces the number of states from $O(2^p)$ to $O(2^{p/2})$ in standard order notation, where p is the number of parity bits. The concept of supercode decoding is well-suited for decoding of GC codes, because the higher levels of the nested-BCH codes are supercodes of the lower levels (cf. Equation (1)).

A supercode $B_i$ of the block code B is a code containing all codewords of B. For a linear code B with parity-check matrix H, we can construct two supercodes $B_1$ and $B_2$ such that $B = B_1 \cap B_2$.

$$\text{Let } H = \begin{pmatrix} H_1 \\ H_2 \end{pmatrix}$$

be the parity-check matrix of the code B. This means that $H_1$ and $H_2$ are two sub-matrices of H. Then the sub-matrices $H_1$ and $H_2$ define the supercodes $B_1$ and $B_2$, respectively.

Example 3

Figure 3:
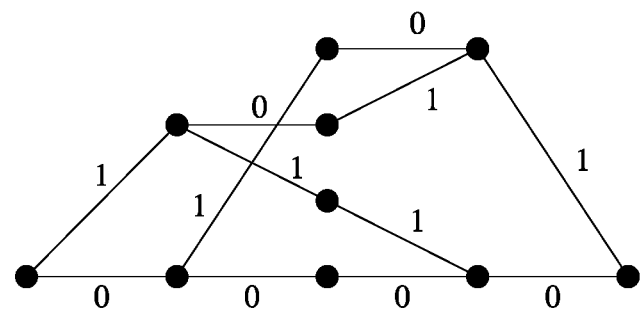
FIG. 3 illustrates trellises of an example code and of its two supercodes. Trellis a) is a representation of the complete code, whereas the trellises b) and c) are the representations of the supercodes.
Figure 3:
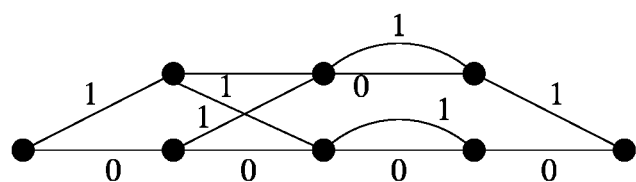
Figure 3:
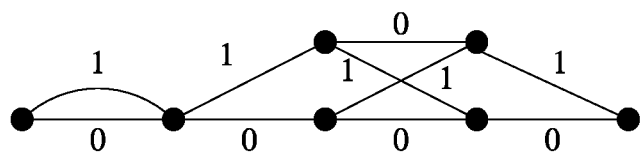

Consider for example the code B from Example 2. We obtain $H_1$=(1 1 0 1)⇒$B_1$={(0000),(1100),(1110),(0010),(1011),(1001),(1011),(0101)} and $H_2$=(0 1 1 1)⇒$B_2$={(0000),(1000),(0110),(1110),(1011),(1101),(0011),(0101)}, where the underlined vectors are the codewords of the code B. The corresponding supercode trellises are depicted in FIG. 3 (b) and FIG. 3 (c), respectively.

Next the proposed sequential decoding algorithm is demonstrated. Any path stored in the stack is associated with a metric value as well as two states $\sigma_{t,1}$ and $\sigma_{t,2}$ which are the states in the trellis for supercode $B_1$ and $B_2$, respectively. We demonstrate decoding Algorithm 2 in the following example, where we consider the same setup as in Example 2. Algorithm 2 can be described in pseudo-code form as follows:

---
Algorithm 2: Sequential stack decoding using supercode trellises.
---
Data: received word r
Result: estimated codeword $\hat{v}$
Sequential decoding starts in the nodes $\sigma_{0,1}$ and $\sigma_{0,2}$ of the supercode trellises;
calculate the metric values for $v_1 = 0$ and $v_1 = 1$;
insert both paths into the stack according to their metric values;
while the top path has not approached the end nodes $\sigma_{n,1}$ and $\sigma_{n,2}$ do
   remove the code sequence $v_t$ at the top from the stack;
   if the branch $v_{t+1} = 0$ exists in the trellis for both nodes $\sigma_{n,1}$ and $\sigma_{n,2}$
   corresponding to the top path $v_t$ then
      calculate the metric M $(r_{t+1}|v_{t+1}) = $ M $(r_t|v_t) + $ M $(r_{t+1}|v_{t+1} = 0)$;
      insert the code sequence $v_{t+1} = (v_t,0)$ into the stack;
   end
   if the branch $v_{t+1} = 1$ exists in the trellis for both nodes $\sigma_{n,1}$ and $\sigma_{n,2}$
   corresponding to the top path $v_t$ then
      calculate the metric M $(r_{t+1}|v_{t+1}) = $ M $(r_t|v_t) + $ M $(r_{t+1}|v_{t+1} = 1)$;
      insert the code sequence $v_{t+1} = (v_t,1)$ into the stack;
   end
end
return the codeword $\hat{v}$ corresponding to the top path in the final iteration;

---

Example 4

The following table represents the stack for the received sequence r=(0010) for algorithm 2 throughout the five iterations needed to calculate the estimated codeword $\hat{v}$:

| 1st iteration | | 2nd iteration | | 3rd iteration | | 4th iteration | | 5th iteration | |
|---|---|---|---|---|---|---|---|---|---|
| $v_t$ | M $(r_t\|v_t)$ | $v_t$ | M $(r_t\|v_t)$ | $v_t$ | M $(r_t\|v_t)$ | $v_t$ | M $(r_t\|v_t)$ | $v_t$ | M $(r_t\|v_t)$ |
| 0 | 0.3 | 00 | 0.6 | 001 | 0.9 | 000 | −2.2 | 0000 | −1.9 |
| 1 | −2.8 | 01 | −2.5 | 000 | −2.2 | 01 | −2.5 | 01 | −2.5 |
|   |   | 1 | −2.8 | 01 | −2.5 | 1 | −2.8 | 1 | −2.8 |
|   |   |   |   | 1 | −2.8 |   |   |   |   |

Accordingly, the top word after the $5^{th}$ and last iteration is output as the estimated codeword $\hat{v}=0000$. A negative value indicates that the received word was in error. A positive value indicates that the received word is error free. More errors in the received word lead to a negative value with large magnitude, which indicates a low reliability of the estimated codeword. This indication can then be used by the subsequent decoding of the outer codes to correct the remaining error(s). Note that the stack in the third iteration differs from Example 2, because the code sequence 001 exists in both supercode trellises but not in the actual code. This code sequence is deleted in the next iteration, because it cannot be extended in both supercode trellises.

As the previous example demonstrates, the time complexity of the proposed algorithm may be larger than with Algorithm 1. This results from code sequences that exist in the supercodes, but are not valid in the actual code. Nevertheless, both algorithms result in the same codeword:
Theorem 1:
Algorithm 1 and Algorithm 2 Result in the Same Estimated Codeword.
Proof:
Both algorithms differ only with respect to the representation of the code. To prove the proposition, it is sufficient to verify that both representations are equivalent. We first prove by induction that the estimated codeword corresponds to a valid path in both supercode trellises, i.e., it is a codeword in both supercodes. The base case is the initial step where the code bits 0 and 1 are inserted in the stack. Note that a linear code has no code bit positions with constant values. Hence, the transitions $v_1=0$ and $v_1=1$ exist in both supercode trellises. For the inductive step, we assume that a path for the code sequence $v_t$ exists in both supercode trellises. It follows from Algorithm 2 that this path is only extended, if the extended path exists in both supercode trellises. This proves the claim that the estimated codeword corresponds to a valid path in both supercode trellises. Now note that $B=B_1 \cap B_2$, i.e., a path is only valid in both supercode trellises if and only if it is a valid codeword of the code B. Algorithm 2 reduces the space complexity required for representing the code. We demonstrate this in the following example.

Example 5

We consider three BCH codes from Table I. All codes have length n=60. In the first level, we use a single-error correcting code. This code has 3,262 nodes in the trellis. This code is a supercode of the BCH code of the second level. The trellis of the second level has 159,742 nodes. However, utilizing the trellis of the first level code, we require only a single additional supercode trellis with 2,884 nodes to represent the code at the second level. Finally, the code at the third level has a trellis with 7,079,886 nodes. Using supercode decoding, we utilize the trellises of the first and second level and require one additional supercode trellis with 2,410 nodes to represent the third code. With sequential decoding the number of visited nodes in the trellis (the number of iterations) depends on the number of transmission errors. Note that with the presented codes the time complexity with Algorithm 2 is at most 1.75 times larger than with Algorithm 1.

C. Selective Soft Input Decoding and List-of-Two Decoding

Next, two techniques to improve the performance and the complexity of Algorithm 1 will be described, starting with a demonstration that the soft input decoding can be omitted in cases where the hard decision of the received vector corresponds to a valid codeword (selective soft input decoding, see subsection). Thereafter, the proposed sequential list-of-two decoding algorithm is described. List-of-two decoding is motivated by the fact that Algorithm 1 is not a maximum-likelihood decoding procedure. Hence, one may search for further codewords in order to find better candidates than the result of Algorithm 1.

(a) Selective soft input decoding: In the following an additive white Gaussian noise channel with binary phase shift keying is considered. Assume that a binary code symbol $v_t \in \mathbb{F}_2$ is mapped to the transmission symbol $x_t \in \{(+1,-1\}$ by $x_t=1-2v_t$. The transmitted symbol vector x is distorted by a noise vector n such that the received sequence is r=x+n. The noise vector n is a vector of independent identically distributed Gaussian random variables with mean zero. Hence, $$p(r_t|x_t = \pm 1) = \frac{1}{\sqrt{2\pi\sigma^2}} \cdot e^{-\frac{(r_t \mp 1)^2}{2}}, \quad (5)$$

where $\sigma^2$ denotes the variance of the Gaussian distribution. For this channel, it is common practice to use the quadratic Euclidean distance $d_E^2(x,r)=\Sigma_{i=1}^n |x_i-r_i|^2$ as metric, because $$\arg(\max_{v\in\mathcal{C}} P(r|v)) = \arg(\min_{v\in\mathcal{C}} d_E^2(x,r)) \quad (6)$$

However, we have $$d_E^2(x,r) = \Sigma_{t=1}^n x_t^2 - 2\Sigma_{t=1}^n x_t r_t + \Sigma_{t=1}^n r_t^2 \quad (7)$$

Let $\tilde{r}_t = \text{sgn}(r_t)$ denote the sign, i.e., the hard decision, of $r_t$. Using $$\Sigma_{t=1}^n x_t r_t = \Sigma_{t=1}^n |r_t| - 2\Sigma_{t:\ x_t\neq \tilde{r}_t} |r_t| \quad (8)$$

one obtains $$d_E^2(x,r) = n + 4\Sigma_{t:\ x_t\neq \tilde{r}_t} |r_t| + 2\Sigma_{t=1}^n |r_t| + \Sigma_{t=1}^n r_t^2 \quad (9)$$

Note that $\Sigma_{t:\ x_t\neq \tilde{r}_t} |r_t|$ is the only term in (9) that depends on x. Consequently, instead of minimizing the quadratic Euclidean distance one may also minimize $\Sigma_{t:\ x_t\neq \tilde{r}_t} |r_t|$. Note that $\Sigma_{t:\ x_t\neq \tilde{r}_t} |r_t|=0$ if the vector $\tilde{r}=(\tilde{r}_1,\ldots,\tilde{r}_n)$ corresponds to a valid codeword. Hence, in this case, $\tilde{r}$ is the maximum-likelihood estimate.

(b) Now we consider list-of-two decoding. In order to enable a trade-off between performance and complexity, we introduce a threshold $\rho$ for the metric of the estimated codeword as exemplified in Algorithm 3 presented below.

---
Algorithm 3: Sequential list-of-two decoding.
---

Data: received word r, threshold $\rho$
Result: estimated codeword $\hat{v}$
Ifr̃corresponds to a valid codeword, then
   return the codeword $\hat{v}$ corresponding to $\tilde{r}$;
else
   calculate a first estimate $v_1$ using either Algorithm 1 or Algorithm 2;
   If M $(r_t|v_t) \geq \rho$ then
     Return the codeword $\hat{v} = v_1$;
   else
     remove $v_1$ from the stack;
     calculate a second estimate $v_2$ using either Algorithm 1 or Algorithm 2;
     If M (r, $v_1$) $\geq$ M (r, $v_2$) then
       Return $\hat{v} = v_1$;
     else
       Return $\hat{v} = v_2$;
     end
   end
end

---

Figure 4:
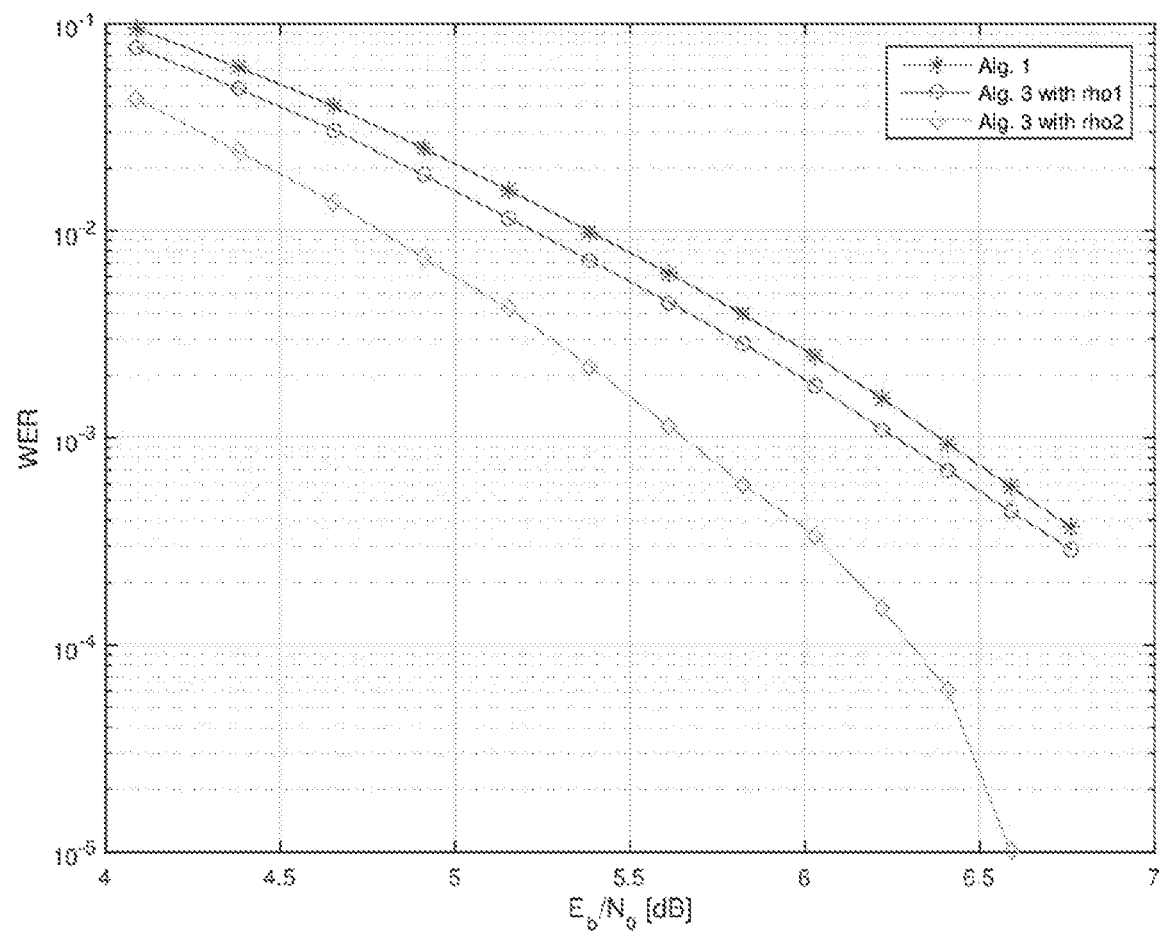
FIG. 4 shows a comparison of Algorithm 1 and Algorithm 3 with respect to the residual word error rate (WER)
Figure 5:
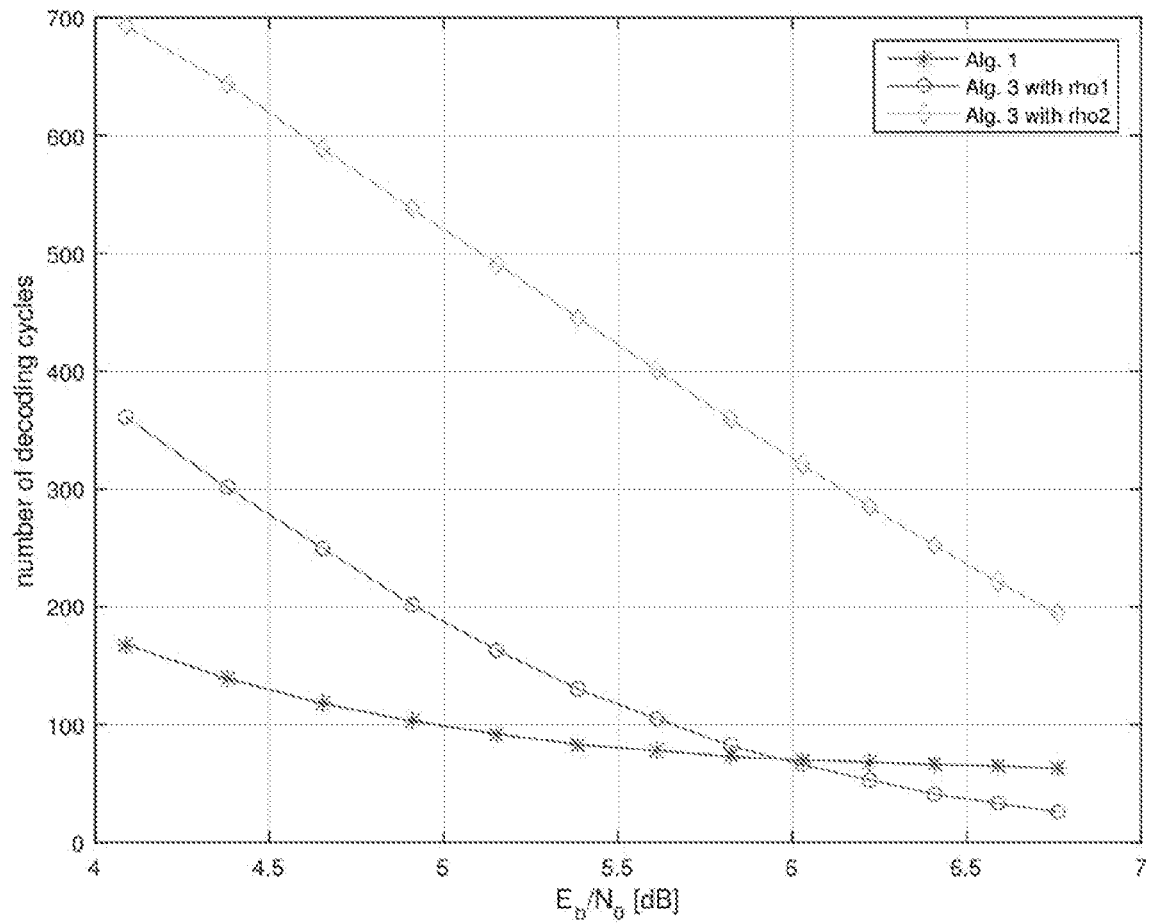
FIG. 5 shows a comparison of Algorithm 1 and Algorithm 3 with respect to the number of iterations.

In Algorithm 3, Algorithm 1 is applied to decode the inner codes at the first level, i.e. the codewords of the code $B^{(0)}$, whereas Algorithm 2 is applied for the lower levels. FIG. 4 presents the performance of Algorithm 1 and Algorithm 3 with respect to the residual word error rate (WER) for transmission over the AWGN channel. The code is a one error correcting binary BCH code of length n=60. This code is later-on used as inner code in the first level of the GC code. The decoding performance and the number of decoding iterations depend on the threshold $\rho$. FIG. 5 presents a comparison with respect to the number of iterations, where we have used two different threshold values denoted by $\rho_1$ and $\rho_2$, respectively. The values of $\rho_2$ were obtained by computer search in order to minimize the word error rate for a given signal to noise ratio. The values of $\rho_1$ were chosen to demonstrate that Algorithm 3 can reduce the word error rate compared with Algorithm 1 with a similar complexity.

III. GC Decoding and Decoding Error Probability

Figure 6:
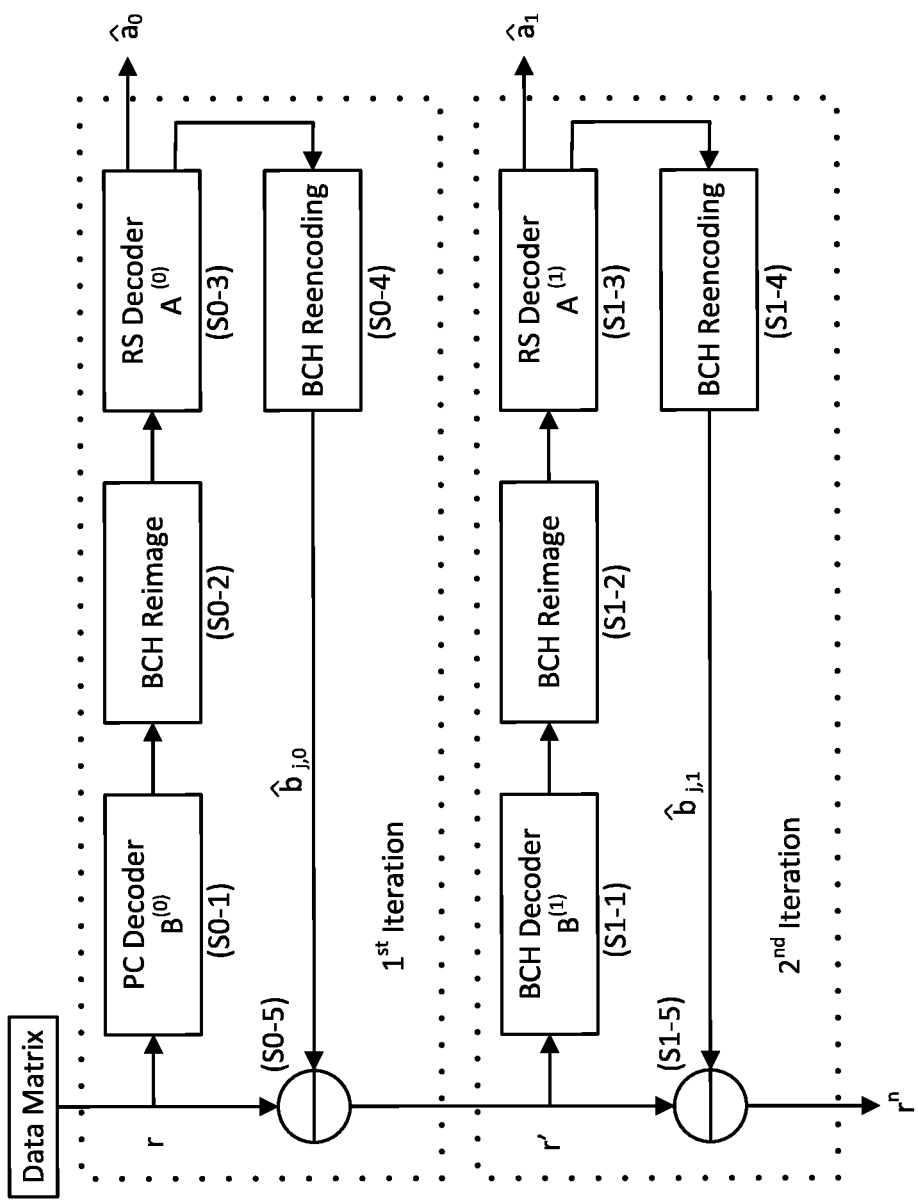
FIG. 6 schematically illustrates a decoding scheme for a codeword matrix obtainable from the encoding scheme of FIG. 2, according to a preferred embodiment of the present invention.

The decoder processes level by level starting with i=0, taking original data received from a channel, such as a flash memory device, as input, wherein the original data is arranged in a data matrix that is structured as illustrated in FIG. 1. FIG. 6 depicts the decoding steps. Let i be the index of the current level. First the columns of the matrix are decoded with respect to $B^{(i)}$ and the information bits have to be inferred (re-imaged) in order to retrieve the code symbols $a_{i,j}$ of $A^{(i)}$ where j is the column index. If all symbols of the code $A^{(i)}$ are inferred the outer code (e.g. RS code) can be decoded. At this point a partial decoding result $\hat{a}_i$ is available. Finally, this result has to be re-encoded using $B^{(i)}$. The estimated codewords of the inner code $B^{(i)}$ are subtracted from the matrix before the next level can be decoded.

The detailed encoding and hard input decoding process is described in [36]. In the first level i=0 the soft input decoding according to Algorithm 1 is used. Starting with the second level, the structure of the nested-BCH codes can be exploited and Algorithm 2 be used, where the code at level i−1 can be used as supercode of the code of level i. For the implementation, the number of decoding iterations for each inner code may be limited. If the number of iterations exceeds a threshold a decoding failure is declared. For the outer (e.g. RS) codes error and erasure decoding is employed [37], where the decoding failures of the inner codes are regarded as erased symbols of the outer (e.g. RS) code.

A. Probability of a Decoding Error

In the following, an analysis of the probability of a decoding error for the GC decoder is presented followed by an example that illustrates the performance of the proposed decoding procedure.

The performance of the soft input decoding of the inner codes can be determined using Monte Carlo simulation. Let $P_{b,j}$ be the error probability for the decoding of the inner code B(j). Furthermore, let $P_{e,j}$ be the corresponding probability of a decoder failure. The probability of a decoding error is bound with the multi-stage decoding algorithm.

Let $T_j = n_a - k_a$ be the number of redundancy symbols for the outer RS code A(j) at the j-th level. The probability $P_{a,j}$ of decoding error with error and erasure decoding at the j-th level can be computed as follows [37]:

$$P_{a,j} = \sum_{q=1}^{T_j} \sum_{t=\left\lfloor\frac{T_j-q}{2}\right\rfloor+1}^{n_a-q} P_q \binom{n_a-q}{t} P_{b,j}^t (1-P_{b,j})^{n_a-q-t} + \sum_{q=T_j+1}^{n_a} P_q \quad (10)$$

where $P_q$ is the probability of q erasures.

$$P_q = \binom{n_a}{t} p_{e,j}^q (1-P_{e,j})^{n_a-q} \quad (11)$$

Using the union bound, the block error rate $P_{GC}$ for the GC code, i.e. the likelihood of the event that at least one level is in error, can be estimated $$P_e \leq \Sigma_{i=0}^{L-1} P_{a,i} \quad (12)$$

Example 6

Consider the code from Example 1. This code has a code rate R=0.806 and was designed to guarantee $P_e \leq 10^{-16}$ according to (12) for $E_B/N_0 \geq 4.7$ dB, where soft input decoding is used in the first three levels and hard input decoding in the remaining levels.

B. Comparison Error Correction Performance

We compare the error correction performance of the GC code in different decoding modes with the performance of long BCH codes with hard input decoding. As performance measure, we use the code rate that is required to guarantee for a given signal to noise ratio an overall word error rate less than $10^{-10}$ or $10^{-16}$, respectively. All codes are constructed similar to the code presented in Example 1. In particular, the inner codes are chosen according to Table I. Whereas the error correcting capability of the outer codes are adapted to obtain the highest possible code rate for a given signal to noise ratio. Note that in this example, the overall code rate of the GC code is at most R=0.9, because of the choice of the inner code.

Figure 7:
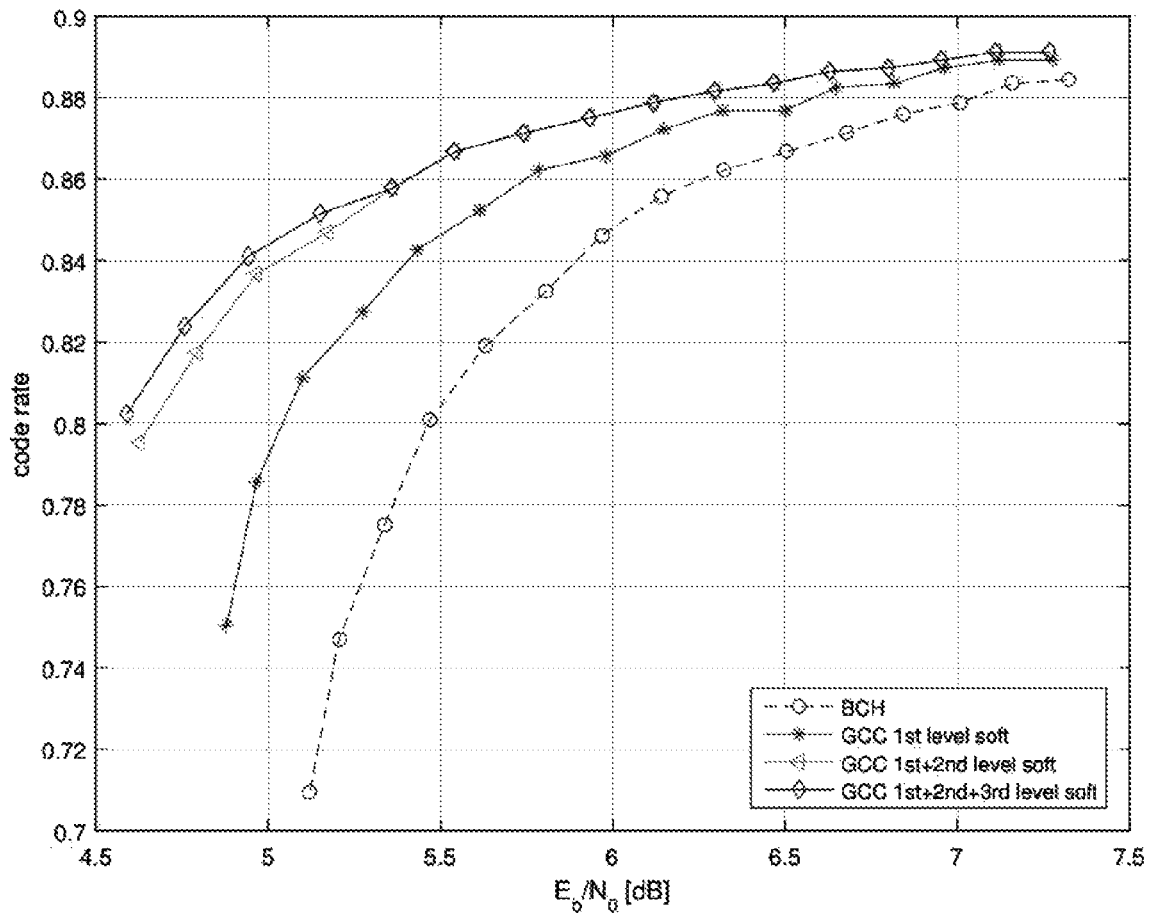
FIG. 7 a diagram showing the code rate versus signal to noise ratio in an exemplary embodiment for a likelihood $P_e=10^{-10}$ of the likelihood of the event that at least one level is in error.
Figure 8:
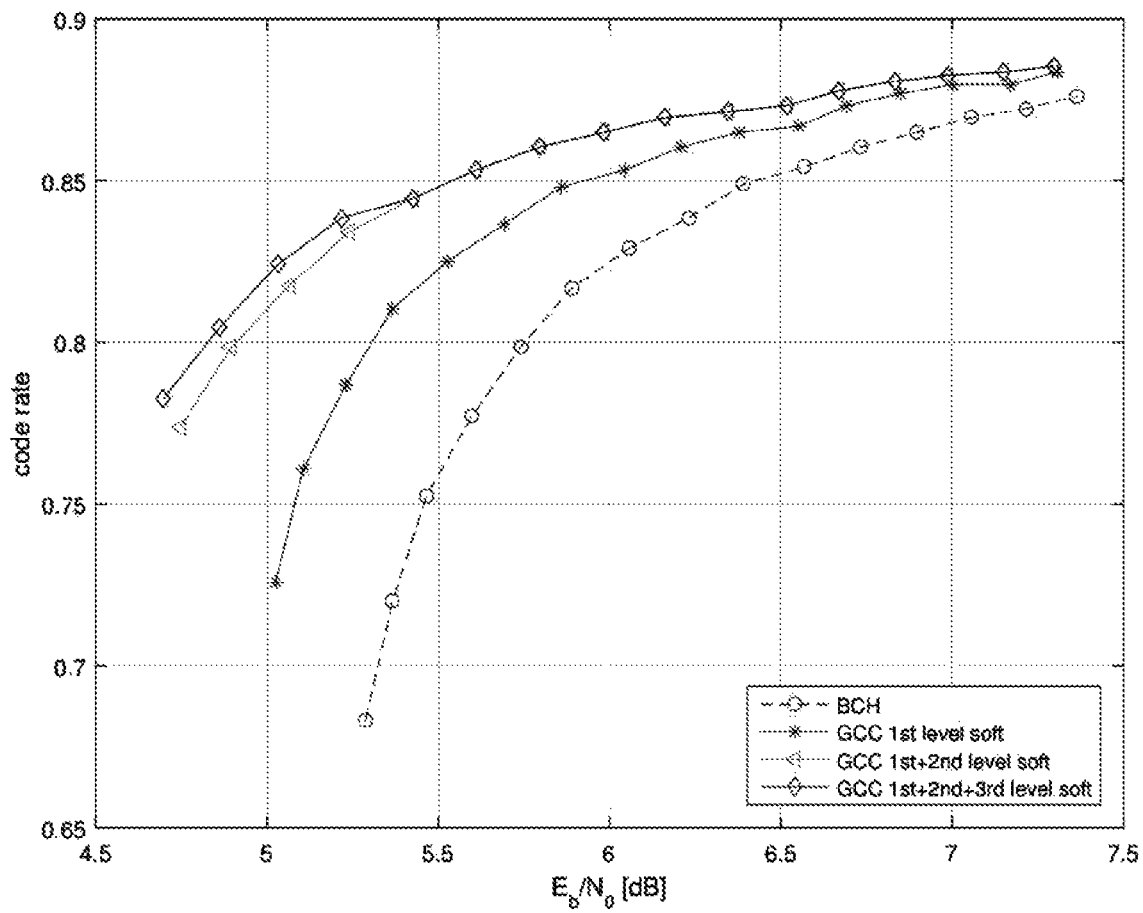
FIG. 8 a diagram showing the code rate versus signal to noise ratio in an exemplary embodiment for a likelihood $P_e=10^{-16}$ of the likelihood of the event that at least one level is in error.

FIG. 7 depicts the code rate versus the signal to noise ratio for $P_e=10^{-10}$, whereas the results for $P_e=10^{-16}$ are presented in FIG. 8. The GC code with soft input decoding outperforms the GC code with hard input decoding for all error probabilities and the BCH code for code rates below 0.88. The soft input decoding was simulated with a 3-bit quantization. The three curves with soft input decoding use different decoding strategies, where the soft input decoding is applied only to the first level, first and the second level, or levels 0 to 2, respectively. The soft input decoding improves the performance by up to 1.3 dB. For instance, the GC code with code rate R=0.8 achieves a block error rate less than $10^{-16}$ at a signal to noise ratio of $E_b/N_0$=4.7 dB which is only 1 dB from the channel capacity of the quantized AWGN channel. For $P_e=10^{-10}$, the code rate R=0.8 is sufficient for a signal to noise ratio (SNR) of $E_b/N_0$≥4.6 dB. Note that soft input decoding of the first and second level is sufficient for all SNR values above $E_b/N_0$=5.5 dB.

IV. Memory System and Architecture of Decoding Device

This section describes an exemplary memory system comprising a decoding device adapted to perform at least one of the decoding methods discussed above in sections II. B and II.C and a related decoder architecture for a GC soft input decoder like the one used in said memory system.

Figure 9:
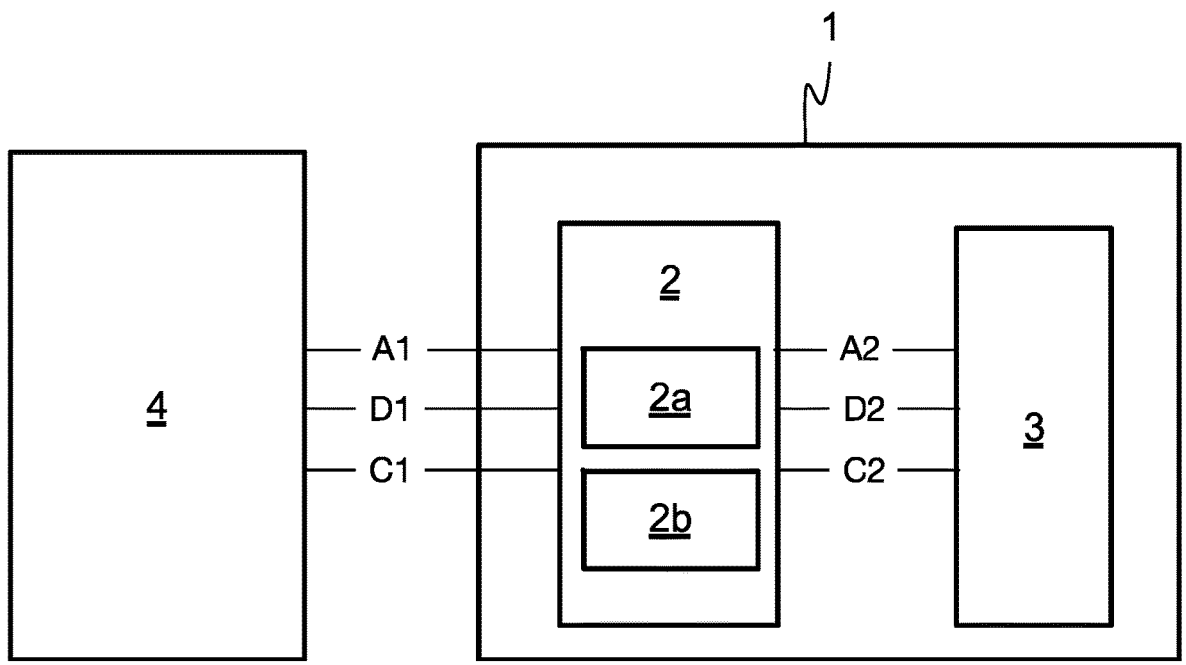
FIG. 9 schematically illustrates a memory system comprising a coding device, particularly decoding device, incorporated in a memory controller, according to a preferred embodiment of the present invention.

FIG. 9 shows an exemplary memory system 1 comprising a memory controller 2 and a memory device 3, which may particularly be a flash memory device, e.g. of the NAND type. The memory system 1 is connected to a host 4, such as a computer to which the memory system 1 pertains, via a set of address lines A1, a set of data lines D1 and set of control lines C1. The memory controller 2 comprises a processing unit 2a and an internal memory 2b, typically of the embedded type, and is connected to the memory 3 via an address bus A2, a data bus D2, and a control bus C2. Accordingly, host 4 has indirect read and/or write access to the memory 3 via its connections A1, D1 and C1 to the memory controller 2, which in turn can directly access the memory 3 via the buses A2, D2 and C2. Each of the set of lines respectively buses A1, D1, C1, A2, D2 and C2 may be implemented by one or more individual communication lines. Bus A2 may also be absent.

The memory controller 2 is also configured as a coding device and adapted to perform the decoding methods of the present invention, particularly as described above with reference to FIGS. 1 to 8. Thus, memory controller 2 is enabled to decode data read from memory device 3. Typically, memory controller 2 will additionally be adapted to perform a respective encoding for generating encoded data to be written to memory device 3. To that purpose, the memory controller 2 may comprise a computer program residing in its internal memory 2b which is configured to perform one or more of these decoding (and encoding) methods when executed on the processing unit 2a of the memory controller 2. Alternatively, the program may for example reside, in whole or in part, in memory device 3 or in an additional program memory (not shown) or may even be implemented in whole or part by a hard-wired circuit.

Next, we discuss a preferred integration of the stack algorithm as inner decoder into the implementation of the GC decoder presented in [36]. Then the stack algorithm implementation for supercode decoding with its subsystems is presented and discussed. The original hard input GC decoder implementation in [36] uses algebraic syndrome decoding. In this implementation, the first levels of B can decode $t_{b,0}$=1 and $t_{b,1}$=2 errors. Thus high error correction capabilities of the outer codes $A^{(0)}$ and $A^{(1)}$ are required. This leads to lower code rates and a high decoding complexity of those outer codes. On the other hand, the soft decoding complexity of the column codes increases significantly with each code level. Hence soft decoding is of interest for the lower levels. Subsequently the algebraic decoding logic for the column code remains in the implementation. Therefore, it is possible to check whether the syndrome is zero. In this case, the codeword can be assumed to be correct, i.e., neither algebraic decoding nor sequential decoding result in a different codeword.

A. Decoding Logic

Figure 10:
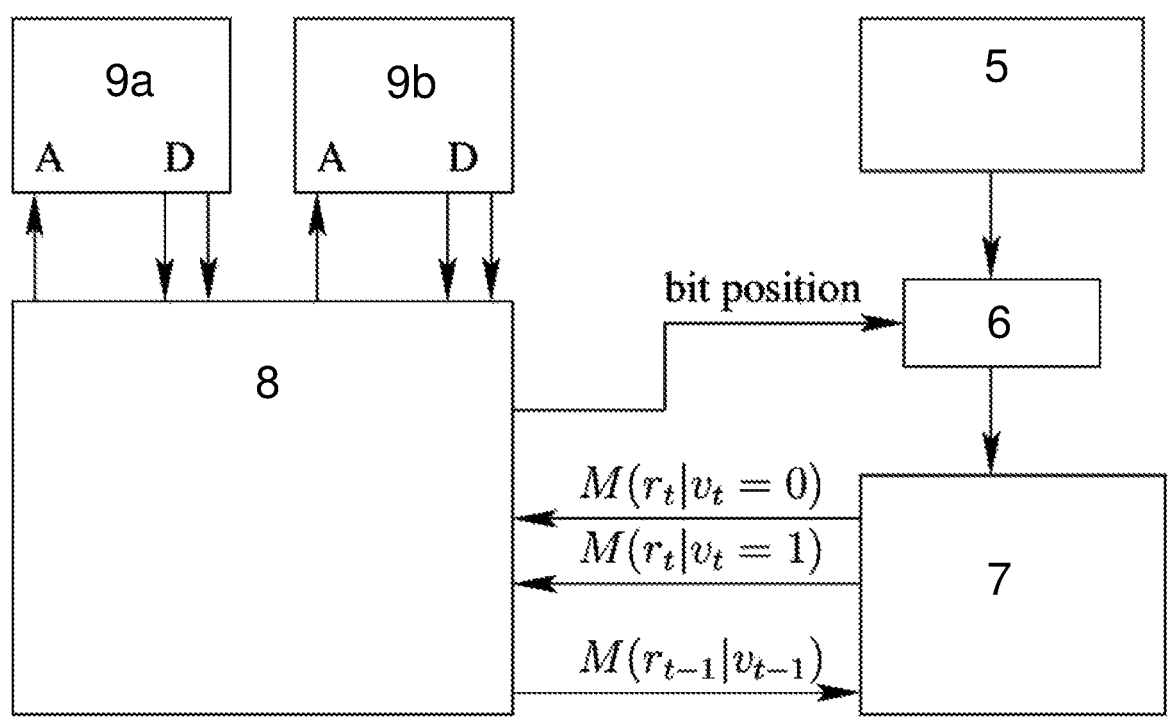
FIG. 10 shows a block diagram of a decoding device for sequential decoding, according to a preferred embodiment of the present invention.

A brief overview of an exemplary decoding system according to a preferred embodiment, which may particularly be implemented in a single decoding device is depicted in FIG. 10. The system consists of a word array 5 of size $n_b$ and a desired width which stores the q-ary word. Furthermore, a demultiplexer 6 selects the currently processed bit position depending on the top path of the stack and delivers this value to a metric calculator 7. Based on the received codeword symbol $r_t$ and the previous metric $M(r_{t-1}|v_{t-1})$ the metric module 7 returns $M(r_t|v_t)$ to a priority queue block 8, which is used to implement a stack for sequential stack decoding. To represent the supercode trellis asynchronous ROM is used, wherein preferably a separate ROM 9a, 9b is used for each trellis. For each supercode, each word of the respective ROM 9a, 9b represents a trellis node $\sigma_{t,i}$ of the respective trellis. The data consists of two pointers for the successor nodes $v_{t+1}$=0 and $v_{t+1}$=1. Depending on the top entry of the priority queue 8 the desired codeword symbol is selected and the next branches for the actual nodes $\sigma_{t,1}$ and $\sigma_{t,2}$ are loaded from the trellis ROM 9a, respectively 9b. The priority queue 8 unloads the top entry and loads the new paths in a single clock cycle.

Each entry of the priority queue 8 contains several elements. The first element is the metric value. The path in the trellis, the length of the path, and a pointer to the current node are stored. All entries have to be ordered by the metric values such that the top entry has the highest value. The process of the priority queue 8 starts with its initialization. The starting node, its initial metric value and the path length are set. Each update cycle begins with the load phase in which the next node pointers are loaded from the trellis ROM 9a, 9b. Simultaneously the next codeword symbol is loaded based on the path length index. The next metric value can be determined based on the code symbol and the available branches. With binary codes, there exists at least one possible branch and at most two branches. The resulting branches are pre-sorted using combinatorial logic. In the following these two entries are called the major and the minor entries, where the major entry has the better metric value.

Figure 11:
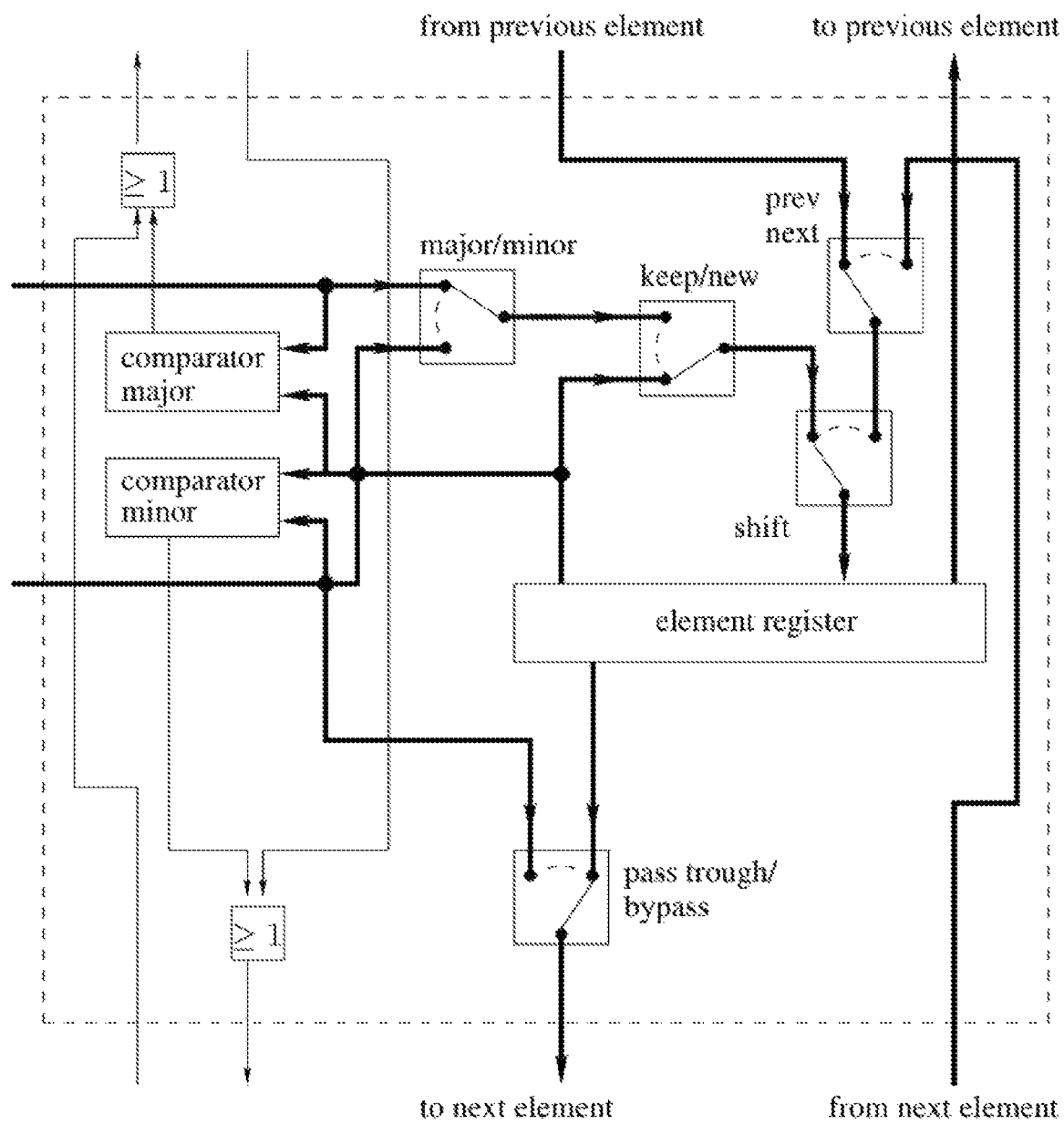
FIG. 11 a block diagram of a priority queue element of the decoding device of FIG. 10.

All priority queue elements are successively ordered in a chain. FIG. 11 shows a possible implementation of a priority queue element. Each element can exchange its date with its previous or next neighbor. Furthermore, each element can decide whether it keeps its own data, take the data from its neighbor, load the new major data or the new minor data. In each element, the metric value is compared with the new value. The result of this comparison is signaled to its predecessor and successor elements. If the signal of a predecessor is false and the major metric value comparator gives a positive signal, the new major value will be stored. Likewise, if an element receives a false signal from its successor and the minor metric value comparator signals anew metric value that is less than the current value, the new minor data is stored. In the case that an element receives a signal from its neighbors, space for the new data has to be created by shifting all entries to next element. There exist two special cases that have to be taken into account. The first special case occurs, if a node has only a single outgoing branch. In this case, the shifting of elements has to be prevented by signaling. The second special case occurs, if the new major and the new minor elements are designated to be inserted into the same entry register. This case can be detected and preventing by passing this value to the next element.

The algorithm terminates, if the maximum possible path length is reached. The stored path in the top element is the decoded codeword. In a practical implementation, an iteration counter may be used, that terminates after a determined maximum number of iterations. This abort can bemused to mark this decoded GCC column as an erasure symbol for the outer (RS) code. In order to decode supercodes (cf. Algorithm 2 or Algorithm 3 based on Algorithm 2), the following extensions have to be implemented. The metric calculation has to take all trellis branches of each supercode into account. Furthermore, all node pointers have to be stored in the priority queue elements. Preferably, for each supercode a distinct ROM, particularly a different ROM device, is used, which represents its trellis.

B. Area Comparison

This section describes an exemplary FPGA implementation of the proposed soft input decoder according to a preferred embodiment and compares it with the hard input decoder presented in [36]. The hard input decoder uses algebraic decoding. It consists of the syndrome calculation, the Berlekamp-Massey algorithm (BMA), and the Chien search module. The soft input decoder is implemented as proposed in Section II-B above. It has two limitations. First, the length of the priority queue is limited to 64 elements. Furthermore, the accuracy of the metric calculation is limited to 16 bits and a 3-bit quantization is used for the input symbols.

Figure 12:
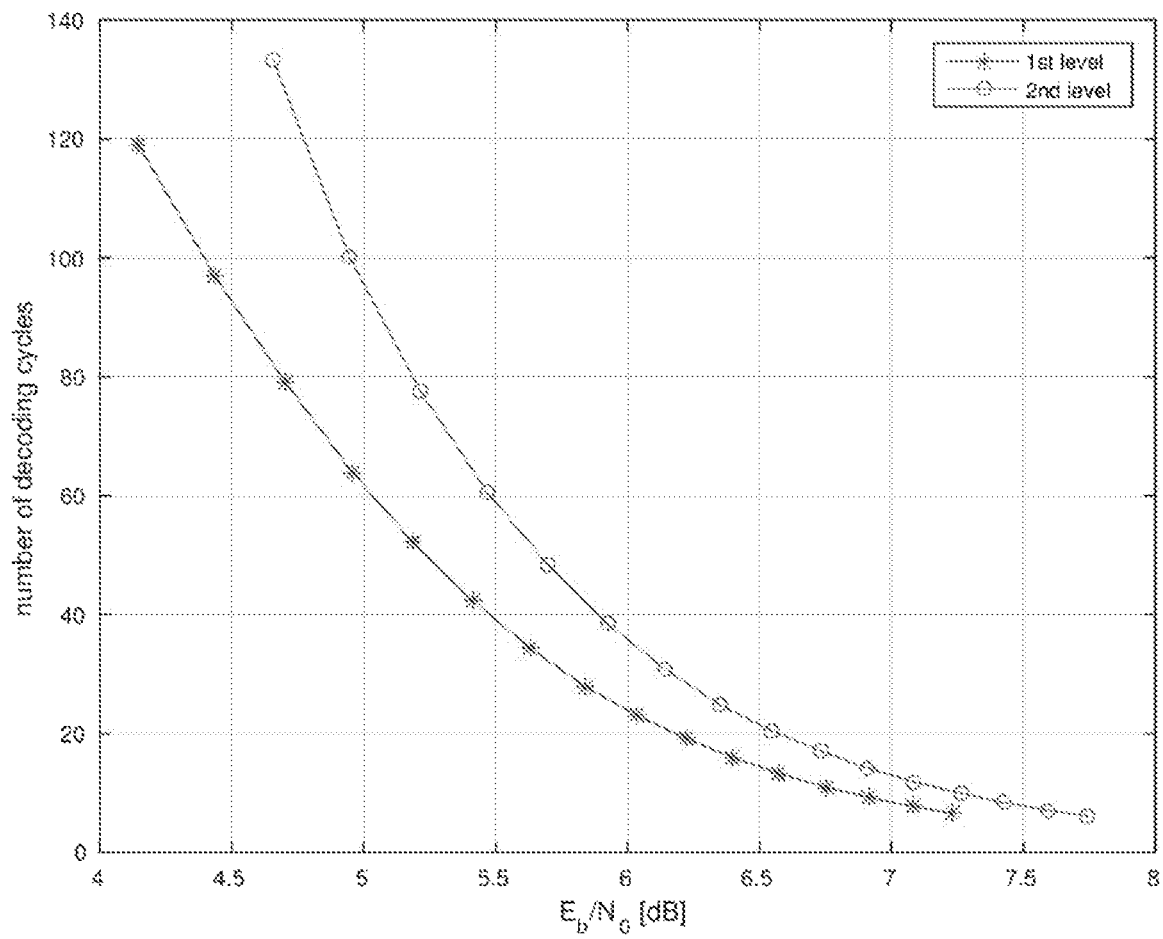
FIG. 12 shows a diagram of the average number of iterations for decoding the first and second level as a function of the signal-to-noise ratio, according to a preferred embodiment of the present invention based on Algorithm 2.

The stack algorithm has a variable execution time depending on the error pattern. This algorithm needs at least 61 cycles to traverse the entire trellis, if no error occurred. This case can be omitted by checking whether the syndrome of a column word is zero. If no errors detected, the soft decoding can be avoided and thus only a single cycle is needed. FIG. 12 compares the average number of cycles needed for the stack algorithm. It shows the dependency between the channel bit error rate and the computational complexity, i.e., fewer errors lead to fewer decoding cycles. Note that the algebraic hard-input decoder needs four cycles for the first and six cycles for the second level.

Next, an FPGA synthesis result for the stack algorithm is presented. The synthesis was performed with a Xilinx Vivado and a Virtex-7 target device. Table II shows the number of slices and look-up tables (LUT) of the hard input and the soft input decoder with 3-bit quantization. From these results, we observe that the number of logic elements required for the stack algorithm is about 80% of the number of logic gates required for the GC hard input decoder.

TABLE II results of FPG Analysis

| Module | LUT | Slices |
|---|---|---|
| RS module (t = 78) | | |
| Syndrome | 1 701 | 1 395 |
| BMA | 21 701 | 6 662 |
| Forney alg. | 1 046 | 729 |
| Chien search | 854 | 712 |
| BCH Module (n = 60, t = 8) | | |
| Syndrome | 184 | 46 |
| BMA | 2 006 | 732 |
| Chien search | 1 557 | 240 |
| reimage | 148 | 336 |
| TOTAL | 29 197 | 10 852 |
| Stack algorithm | 23 896 | 9 885 |

While above at least one exemplary embodiment of the present invention has been described, it has to be noted that a great number of variation thereto exists. Furthermore, it is appreciated that the described exemplary embodiments only illustrate non-limiting examples of how the present invention can be implemented and that it is not intended to limit the scope, the application or the configuration of the herein-described apparatus' and methods. Rather, the preceding description will provide the person skilled in the art with constructions for implementing at least one exemplary embodiment of the invention, wherein it has to be understood that various changes of functionality and the arrangement of the elements of the exemplary embodiment can be made, without deviating from the subject-matter defined by the appended claims and their legal equivalents.

REFERENCES

[1] A. Fahrner, H. Griesser, R. Klarer, and V. Zyablov, "Low-complexity GEL codes for digital magnetic storage systems," *IEEE Transactions on Magnetics*, vol. 40, no. 4, pp. 3093-3095, July 2004.

[2] J. Freudenberger, U. Kaiser, and J. Spinner, "Concatenated code constructions for error correction in non-volatile memories," in *Int. Symposium on Signals, Systems, and Electronics (ISSSE)*, Potsdam, October 2012, pp. 1-6.

[3] J. Freudenberger, J. Spinner, and S. Shavgulidze, "Generalized concatenated codes for correcting two-dimensional clusters of errors and independent errors," in *Int. Conference on Communication and Signal Processing (CSP)*, Castelldefels-Barcelona, February 2014, pp. 1-5.

[4] I. Dumer, *Concatenated codes and their multilevel generalizations*. in Handbook of Coding Theory, Vol. II, Elsevier, Amsterdam, 1998.

[5] M. Bossert, *Channel coding for telecommunications*. Wiley, 1999.

[6] V. Zyablov, S. Shavgulidze, and M. Bossert, "An introduction to generalized concatenated codes," *European Transactions on Telecommunications*, vol. 10, no. 6, pp. 609-622, 1999.

[7] J. Spinner and J. Freudenberger, "Decoder architecture for generalized concatenated codes," *IET Circuits, Devices & Systems*, vol. 9, no. 5, pp. 328-335, 2015.

[8] A. Neubauer, J. Freudenberger, and V. Kühn, *Coding Theory: Algorithms, Architectures and Applications*. John Wiley & Sons, 2007.

[9] D. Chase, "Class of algorithms for decoding block codes with channel measurement information," IEEE *Transactions on Information Theory*, pp. 170-182, 1972.

[10] C. Argon, S. McLaughlin, and T. Souvignier, "Iterative application of the Chase algorithm on Reed-Solomon product codes," *Proceedings IEEE ICC* 2001, pp. 320-324, 2001.

[11] M. Fossorier and S. Lin, "Soft-decision decoding of linear block codes based on ordered statistics," *IEEE Trans. Inform. Theory*, vol. IT-41, pp. 1379-1396, September 1995.

[12] B. Dorsch, "A decoding algorithm for binary block codes and J-ary output channels," *Information Theory, IEEE Transactions on*, vol. 20, no. 3, pp. 391-394, May 1974.

[13] M. Tomlinson, C. Tjhai, and M. Ambroze, "Extending the Dorsch decoder towards achieving maximum-likelihood decoding for linear codes," *IET Communications*, vol. 1, no. 3, pp. 479-488, June 2007.

[14] A. Gortan, R. Jasinski, W. Godoy, and V. Pedroni, "Achieving near-MLD performance with soft information-set decoders implemented in FPGAs," in 2010 *IEEE Asia Pacific Conference on Circuits and Systems (APCCAS)*, December 2010, pp. 312-315.

[15] L. Aguado and P. Farrell, "On hybrid stack decoding algorithms for block codes," Information Theory, *IEEE Transactions on*, vol. 44, no. 1, pp. 398-409, January 1998.

[16] J. Wolf, "Efficient maximum likelihood decoding of linear block codes using a trellis," *IEEE Transactions on Information Theory*, vol. 24, no. 1, pp. 76-80, January 1978.

[17] J. Freudenberger, T. Wegmann, and J. Spinner, "An efficient hardware implementation of sequential stack decoding of binary block codes," in *IEEE 5th International Conference on Consumer Electronics—Berlin (ICCE-Berlin)*, September 2015, pp. 135-138.

[18] J. Freudenberger and M. Bossert, "Maximum-likelihood decoding based on supercodes," in *Proc. 4th. International ITG Conference Source and Channel Coding*, Erlangen, Germany, January 2004, pp. 185-190.

[19] J. Freudenberger, *Bounded Distance Decoding and Decision Feedback*. Düsseldorf, Germany: VDI Verlag, 2004.

[20] R. Micheloni, A. Marelli, and R. Ravasio, *Error Correction Codes for Non-Volatile Memories*. Springer, 2008.

[21] X. Zhang and K. K. Parhi, "High-speed architectures for parallel long BCH encoders," *IEEE Transactions on Very Large Scale Integration (VLSI) Systems*, vol. 13, no. 7, pp. 872-877, 2005.

[22] F. Sun, S. Devarajan, K. Rose, and T. Zhang, "Design of on-chip error correction systems for multi level NOR and NAND flash memories," *IET Circuits, Devices Systems*, vol. 1, no. 3, pp. 241-249, June 2007.

[23] J. Freudenberger and J. Spinner, "A configurable Bose-Chaudhuri-Hocquenghem codec architecture for flash controller applications," Journal of Circuits, Systems, and Computers, vol. 23, no. 2, pp. 1-15, February 2014.

[24] S. Cho, D. Kim, J. Choi, and J. Ha, "Block-wise concatenated BCH codes for NAND flash memories," IEEE Transactions on Communications, vol. 62, no. 4, pp. 1164-1177, April 2014.

[25] D. Kim and J. Ha, "Quasi-primitive block-wise concatenated BCH codes for NAND flash memories," in IEEE Information Theory Workshop (ITW), November 2014, pp. 611-615.

[26] G. Dong, N. Xie, and T. Zhang, "On the use of soft-decision error-correction codes in NAND Flash memory," *IEEE Transactions on Circuits and Systems I: Regular Papers*, vol. 58, no. 2, pp. 429-439, February 2011.

[27] K. Zhao, W. Zhao, H. Sun, X. Zhang, N. Zheng, and T. Zhang, "LDPC-in-SSD: Making advanced error correction codes work effectively in solid state drives," in *Presented as part of the 11$^{th}$ USENIX Conference on File and Storage Technologies (FAST13)*. San Jose, Calif.: USENIX, 2013, pp. 243-256. [Online]. Available: https://www.usenix.org/conference/fast13/technical-sessions/presentation/zhao

[28] J. Wang, K. Vakilinia, T.-Y. Chen, T. Courtade, G. Dong, T. Zhang, H. Shankar, and R. Wesel, "Enhanced precision through multiple reads for ldpc decoding in flash memories," *IEEE Journal on Selected Areas in Communications*, vol. 32, no. 5, pp. 880-891, May 2014.

[29] W. Lin, S.-W. Yen, Y.-C. Hsu, Y.-H. Lin, L.-C. Liang, T.-C. Wang, P.-Y. Shih, K.-H. Lai, K.-Y. Cheng, and C.-Y. Chang, "A low power and ultrahigh reliability LDPC error correction engine with digital signal processing for embedded NAND flash controller in 40 nm coms," in *Symposium on VLSI Circuits Digest of Technical Papers*, June 2014, pp. 1-2.

[30] K. Haymaker and C. A. Kelley, "Structured bit-interleaved LDPC codes for MLC flash memory," *IEEE Journal on Selected Areas in Communications*, vol. 32, no. 5, pp. 870-879, May2014.

[31] *Solid-State Drive (SSD) Requirements and Endurance Test Method (JESD218)*. JEDEC SOLID STATE TECHNOLOGY ASSOCIATION, 2010.

[32] S. Li and T. Zhang, "Improving multi-level NAND flash memory storage reliability using concatenated BCH-TCM coding," *IEEE Transactions on Very Large Scale Integration (VLSI) Systems*, vol. 18, no. 10, pp. 1412-1420, October 2010.

[33] S. Qi, D. Feng, and J. Liu, "Optimal voltage signal sensing of nand flash memory for ldpc code," in *Signal Processing Systems (SiPS), 2014 IEEE Workshop on*, October 2014, pp. 1-6.

[34] J. Massey, "Variable-length codes and the Fano metric," *IEEE Transactions on Information Theory*, vol. 18, no. 1, pp. 196-198, 1972.35] V. Sorokine and F. Kschischang, "A sequential decoder for linear block codes with a variable bias-term metric," *IEEE Transactions on Information Theory*, vol. 44, no. 1, pp. 410-416, 1998.

[36] J. Spinner and J. Freudenberger, "Design and implementation of a pipelined decoder for generalized concatenated codes," in *Proceedings of 27th Symposium on Integrated Circuits and Systems Design (SBCCI)*, Aracaju, Brazil, September 2014, pp. 1-16.

[37] L. Weiburn and J. Cavers, "Improved performance of Reed-Solomon decoding with the use of pilot signals for erasure generation," in *Vehicular Technology Conference, 1998. VTC 98. 48th IEEE*, vol. 3, May 1998, pp. 1930-1934 vol. 3.

[38] C. Yang, Y. Emre, and C. Chakrabarti, "Product code schemes for error correction in MLC NAND flash memories," *IEEE Transactions on Very Large Scale Integration (VLSI) Systems*, vol. 20, no. 12, pp. 2302-2314, December 2012.

[39] J. Oh, J. Ha, J. Moon, and G. Ungerboeck, "Rs-enhanced TCM for multilevel flash memories," *IEEE Transactions on Communications*, vol. 61, no. 5, pp. 1674-1683, May 2013.

[40] E. Yaakobi, J. Ma, L. Grupp, P. Siegel, S. Swanson, and J. Wolf, "Error characterization and coding schemes for flash memories," in *IEEE GLOBECOM Workshops*, December 2010, pp. 1856-1860.

[41] E. Yaakobi, L. Grupp, P. Siegel, S. Swanson, and J. Wolf, "Characterization and error-correcting codes for TLC flash memories," in *Computing, Networking and Communications (ICNC), 2012 International Conference on*, January 2012, pp. 486-491.

[42] R. Gabrys, E. Yaakobi, and L. Dolecek, "Graded bit-error-correcting codes with applications to flash memory," *IEEE Transactions on Information Theory*, vol. 59, no. 4, pp. 2315-2327, April 2013.

[43] R. Gabrys, F. Sala, and L. Dolecek, "Coding for unreliable flash memory cells," *IEEE Communications Letters*, vol. 18, no. 9, pp. 1491-1494, September 2014.

LIST OF REFERENCE SIGNS 1 memory system
2 memory controller, including coding device
2a processing unit
2b embedded memory of memory controller
3 nonvolatile memory (NVM), particularly flash memory
4 host
5 word array
6 demultiplexer
7 metric calculator
8 priority queue block, implementing stack
9a,b read-only memory, ROM
A address lines of ROMs
D data lines of ROMs
A1 address line(s) to/from host
D1 data line(s) to/from host
C1 control line(s) to/from host
A2 address bus of NVM, e.g. flash memory
D2 data bus of NVM, e.g. flash memory
C2 control bus of NVM, e.g. flash memory

What is claimed is:

1. A soft input decoding method for a generalized concatenated code, GCC, wherein the GCC is constructed from L inner block codes $B^{(\cdots)}$ and L outer codes, wherein L≥2 denotes the number of levels of the GCC and the inner code of a higher level is a sub-code of the inner code of a respectively preceding lower level, if any, the method comprising:

using one or more decoding devices to iteratively decode level by level original data received from a data channel, wherein such iterative decoding includes performing in each level:

a first decoding process for decoding input data of at least one current level l based on the inner block of codes of the current level l and providing respective decoded data, the input data of the lowest level including the original data and the input data of each subsequent level being based on the decoding result of a previous level; and a subsequent second decoding process for decoding the outer code of the current level l based on the output data of the first decoding process to estimate a decoding result of the current level l, wherein the decoding result of a highest level is output as decoded data;

wherein:

the first decoding process of at least one current level l other than the lowest level comprises trellis-based sequential stack decoding of the input data of the current level l using as a soft input information characterizing the reliability of the data channel;

the sequential stack decoding is based on a first trellis representing a first supercode $B_1^{(l)}$ of the inner block code $B^{(l)}$ of the current level l and on a second trellis representing a second supercode $B_2^{(l)}$ of $B^{(l)}$, with $B^{(l)} = B_1^{(l)} \cap B_2^{(l)}$, wherein a supercode of $B^{(l)}$ is a code containing all codewords of $B^{(l)}$ and the redundancy of each of the first supercode $B_1^{(l)}$ and the second supercode $B_2^{(l)}$ is lower than that of $B^{(l)}$;

the corresponding inner code $B^{(l-1)}$ of the immediately preceding level l-1 is reused as one of the supercodes $B_1^{(l)}$ and $B_2^{(l)}$; and the sequential stack decoding is configured to deliver only codewords comprised in the output data of the first decoding process that are represented by both the first trellis and the second trellis.

2. The soft input decoding method of claim 1, wherein the block code of the lowest level of each of the inner block codes is a single error correction code.

3. The soft input decoding method of claim 1, wherein:
the inner codes are each nested Bose-Chaudhuri-Hocquenghem (BCH) codes;
the extended BCH code in the lowest level of the inner nested BCH codes is a single parity-check (SPC) code; and
the extended BCH code in at least one higher level of the inner nested BCH codes has an error correction capability and is a sub-code of the BCH code of the lowest nesting level.

4. The soft input decoding method of claim 1, the method further comprising:
arranging the original data received from a data channel in a two dimensional original data matrix having a first dimension $n_a$ equal to the length of the outer codes and a second dimension $n_b$ equal to the length of the inner block codes, wherein a line of the first dimension of a matrix is a row of the matrix and a line of its second dimension is a column of the matrix, or vice versa, and the outer codes are defined over a Galois-Field $GF(2^m)$, with m elements of each line of the second dimension representing one symbol of the Galois-Field $GF(2^m)$; and a) a first iteration corresponding to the lowest level of the inner block codes of the original data matrix, wherein the first decoding process includes:
applying a decoding scheme of the inner block code of the lowest level to the lines of the second dimension of the original data matrix with respect to the lowest level of the inner nested block codes in which the lines of a second dimension of the original data matrix are encoded in order to obtain an intermediate decoding data matrix of the first iteration and to determine erasure information characterizing lines of the second dimension of the original data matrix in which an erasure has been detected based on the decoding of the inner block code of the lowest level;

inferring the information bits contained in the lines of the second dimension of the intermediate decoding data matrix of the first iteration in order to retrieve code symbols ($a_{i,j}$) of the outer codes in which the lines of a first dimension of the original data matrix are encoded;

the second decoding process includes:

applying outer decoding corresponding to the respective outer codes to the retrieved code symbols in the lines of the first dimension of the intermediate decoding data matrix of the first iteration in order to obtain a partial decoding result matrix of the first iteration, wherein the erasure information is used during outer decoding to identify erroneous symbols of the outer code in the intermediate decoding data matrix of the first iteration;

re-encoding said partial decoding result matrix of the first iteration by applying an encoding scheme of the inner block code of the lowest level to the second dimension of this matrix to obtain a re-encoded matrix of the first iteration; and subtracting there-encoded matrix of the first iteration from the original data matrix in order to obtain a start matrix for a subsequent further iteration; and (b) for each of the further levels of the inner block codes, a respective further iteration wherein the first decoding step of the respective level includes:

applying a decoding scheme of the inner block code of the current level to the lines of the second dimension of the start matrix of the current iteration with respect to the current level of the inner block codes in which the lines of a second dimension of the start matrix of the current iteration are encoded in order to obtain an intermediate decoding data matrix of the current iteration;

inferring the information bits contained in the lines of the second dimension of the intermediate decoding data matrix of the current iteration in order to retrieve code symbols of the outer codes in which the lines of a first dimension of the original data matrix are encoded;

applying outer decoding corresponding to the respective outer codes used for obtaining the original data matrix during encoding, to the retrieved code symbols in the lines of the first dimension of the intermediate decoding data matrix of the current iteration in order to obtain a partial decoding result matrix of the current iteration;

if the current iteration corresponds to the highest nesting level of the inner block codes in the original data matrix, outputting the partial decoding result matrix of the current iteration as the decoded data, and otherwise, re-encoding said partial decoding result matrix of the current iteration by applying an encoding scheme of the inner block code of the current level to the second dimension of this matrix to obtain a re-encoded matrix of the current iteration, and subtracting there-encoded matrix of the current iteration from the start matrix of the current iteration in order to obtain a start matrix for a subsequent further iteration.

5. The soft input decoding method of claim 1, the method further including, in at least one first decoding process using sequential stack decoding, terminating the decoding of a data word in the input data of the inner code of the current level, when:

a maximum possible path length is reached, wherein the trellis path having the best metric value among the paths accrued so far in the stack is selected as the decoded codeword corresponding to the data word; or a predetermined maximum number of iterations have occurred.

6. The soft input decoding method of claim 5, the method further including:

if the termination is caused because a predetermined maximum number of iterations have occurred, marking the output data of the current first decoding step as an erasure symbol for the corresponding outer code used in the second decoding step of the current level.

7. The soft input decoding method of claim 1, wherein the one or more decoding devices comprise:

a plurality of distinct memories or memory areas which can be simultaneously accessed and each of which is configured to store a data representation of a trellis used in a decoding method.

8. A soft input data decoder system for a generalized concatenated code, GCC, wherein the GCC is constructed from L inner block codes $B^{(\cdots)}$ and L outer codes, wherein L≥2 denotes the number of levels of the GCC and the inner code of a higher level is a sub-code of the inner code of a respectively preceding lower level, if any, the method comprising:

at least one decoding device configured to iteratively decode level by level original data received from a data channel, wherein such iterative decoding includes performing in each level:

a first decoding process of at least one current level l based on the inner block of codes of the current level l and providing respective decoded data, the input data of the lowest level including the original data and the input data of each subsequent level being based on the decoding result of a previous level; and a subsequent second decoding process for decoding the outer code of the current level l based on the output data of the first decoding process to estimate a decoding result of the current level l, wherein the decoding result of a highest level is output as decoded data;

wherein:

the first decoding process of at least one current level l other than the lowest level comprises trellis-based sequential stack decoding of the input data of the current level l using as a soft input information characterizing the reliability of the data channel;

the sequential stack decoding is based on a first trellis representing a first supercode $B_1^{(l)}$ of the inner block code $B^{(l)}$ of the current level l and on a second trellis representing a second supercode $B_2^{(l)}$ of $B^{(l)}$, with $B^{(l)}=B_1^{(l)} \cap B_2^{(l)}$, wherein a supercode of $B^{(l)}$ is a code containing all codewords of $B^{(l)}$ and the redundancy of each of the first supercode $B_1^{(l)}$ and the second supercode $B_2^{(l)}$ is lower than that of $B^{(l)}$;

the corresponding inner code $B^{(l-1)}$ of the immediately preceding level l-1 is reused as one of the supercodes $B_1^{(l)}$ and $B_2^{(l)}$; and the sequential stack decoding is configured to deliver only codewords comprised in the output data of the first decoding process that are represented by both the first trellis and the second trellis.

9. The soft input data decoder system of claim 8, wherein the block code of the lowest level of each of the inner block codes is a single error correction code.

10. The soft input data decoder system of claim 8, wherein:

the inner codes are each nested Bose-Chaudhuri-Hocquenghem (BCH) codes;
the extended BCH code in the lowest level of the inner nested BCH codes is a single parity-check (SPC) code; and
the extended BCH code in at least one higher level of the inner nested BCH codes has an error correction capability and is a sub-code of the BCH code of the lowest nesting level.

11. The soft input data decoder system of claim 8, the at least one decoding device further configured to:
arranging the original data received from a data channel in a two dimensional original data matrix having a first dimension $n_a$ equal to the length of the outer codes and a second dimension $n_b$ equal to the length of the inner block codes, wherein a line of the first dimension of a matrix is a row of the matrix and a line of its second dimension is a column of the matrix, or vice versa, and the outer codes are defined over a Galois-Field $GF(2^m)$, with m elements of each line
of the second dimension representing one symbol of the Galois-Field $GF(2^m)$; and
a) a first iteration corresponding to the lowest level of the inner block codes of the original data matrix, wherein the first decoding process includes:
applying a decoding scheme of the inner block code of the lowest level to the lines of the second dimension of the original data matrix with respect to the lowest level of the inner nested block codes in which the lines of a second dimension of the original data matrix are encoded in order to obtain an intermediate decoding data matrix of the first iteration and to determine erasure information characterizing lines of the second dimension of the original data matrix in which an erasure has been detected based on the decoding of the inner block code of the lowest level;
inferring the information bits contained in the lines of the second dimension of the intermediate decoding data matrix of the first iteration in order to retrieve code symbols (ai,j) of the outer codes in which the lines of a first dimension of the original data matrix are encoded;
the second decoding process includes:
applying outer decoding corresponding to the respective outer codes to the retrieved code symbols in the lines of the first dimension of the intermediate decoding data matrix of the first iteration in order to obtain a partial decoding result matrix of the first iteration, wherein the erasure information is used during outer decoding to identify erroneous symbols of the outer code in the intermediate decoding data matrix of the first iteration;
re-encoding said partial decoding result matrix of the first iteration by applying an encoding scheme of the inner block code of the lowest level to the second dimension of this matrix to obtain a re-encoded matrix of the first iteration; and
subtracting there-encoded matrix of the first iteration from the original data matrix in order to obtain a start matrix for a subsequent further iteration; and
(b) for each of the further levels of the inner block codes, a respective further iteration wherein the first decoding step of the respective level includes:
applying a decoding scheme of the inner block code of the current level to the lines of the second dimension of the start matrix of the current iteration with respect to the current level of the inner block codes in which the lines of a second dimension of the start matrix of the current iteration are encoded in order to obtain an intermediate decoding data matrix of the current iteration;
inferring the information bits contained in the lines of the second dimension of the intermediate decoding data matrix of the current iteration in order to retrieve code symbols of the outer codes in which the lines of a first dimension of the original data matrix are encoded;
applying outer decoding corresponding to the respective outer codes used for obtaining the original data matrix during encoding, to the retrieved code symbols in the lines of the first dimension of the intermediate decoding data matrix of the current iteration in order to obtain a partial decoding result matrix of the current iteration;
if the current iteration corresponds to the highest nesting level of the inner block codes in the original data matrix, outputting the partial decoding result matrix of the current iteration as the decoded data, and
otherwise, re-encoding said partial decoding result matrix of the current iteration by applying an encoding scheme of the inner block code of the current level to the second dimension of this matrix to obtain a re-encoded matrix of the current iteration, and subtracting thereencoded matrix of the current iteration from the start matrix of the current iteration in order to obtain a start matrix for a subsequent further iteration.

12. The soft input data decoder system of claim 8, the at least one data decoding device further configured to, in at least one first decoding process using sequential stack decoding, terminate the decoding of a data word in the input data of the inner code of the current level, when:
a maximum possible path length is reached, wherein the trellis path having the best metric value among the paths accrued so far in the stack is selected as the decoded codeword corresponding to the data word; or
a predetermined maximum number of iterations have occurred.

13. The soft input data decoder system of claim 12, wherein the at least one data decoding device is further configured to marking the output data of the current first decoding step as an erasure symbol for the corresponding outer code used in the second decoding step of the current level if the termination is caused because a predetermined maximum number of iterations have occurred.

14. A soft input decoding system for a generalized concatenated code, GCC, wherein the GCC is constructed from L inner block codes $B^{(\cdots)}$ and L outer codes, wherein L≥2 denotes the number of levels of the GCC and the inner code of a higher level is a sub-code of the inner code of a respectively preceding lower level, if any, the decoding system comprising:
a processor and a computer readable medium, wherein the computer readable medium includes instructions executable by the processor to:
iteratively decode level by level original data received from a data channel, wherein such iterative decoding includes performing in each level:
a first decoding process of at least one current level l based on the inner block of codes of the current level l and providing respective decoded data, the input data of the lowest level including the original data and the input data of each subsequent level being based on the decoding result of a previous level; and
a subsequent second decoding process for decoding the outer code of the current level l based on the output data of the first decoding process to estimate a decoding result of the current level l, wherein the decoding result of a highest level is output as decoded data;

wherein:

the first decoding process of at least one current level l other than the lowest level comprises trellis-based sequential stack decoding of the input data of the current level l using as a soft input information characterizing the reliability of the data channel;

the sequential stack decoding is based on a first trellis representing a first supercode $B_1^{(l)}$ of the inner block code $B^{(l)}$ of the current level l and on a second trellis representing a second supercode $B_2^{(l)}$ of $B^{(l)}$, with $B^{(l)}=B_1^{(l)} \cap B_2^{(l)}$, wherein a supercode of $B^{(l)}$ is a code containing all codewords of $B^{(l)}$ and the redundancy of each of the first supercode $B_1^{(l)}$ and the second supercode $B_2^{(l)}$ is lower than that of $B^{(l)}$;

the corresponding inner code $B^{(l-1)}$ of the immediately preceding level l-1 is reused as one of the supercodes $B_1^{(l)}$ and $B_2^{(l)}$; and the sequential stack decoding is configured to deliver only codewords comprised in the output data of the first decoding process that are represented by both the first trellis and the second trellis.

15. The soft input decoding system of claim 14, wherein the block code of the lowest level of each of the inner block codes is a single error correction code.

16. The soft input decoding system of claim 14, wherein:

the inner codes are each nested Bose-Chaudhuri-Hocquenghem (BCH) codes;

the extended BCH code in the lowest level of the inner nested BCH codes is a single parity-check (SPC) code; and the extended BCH code in at least one higher level of the inner nested BCH codes has an error correction capability and is a sub-code of the BCH code of the lowest nesting level.

17. The soft input decoding system of claim 14, wherein the instructions executable by the processor are further executable to:

arrange the original data received from a data channel in a two dimensional original data matrix having a first dimension $n_a$ equal to the length of the outer codes and a second dimension $n_b$ equal to the length of the inner block codes, wherein a line of the first dimension of a matrix is a row of the matrix and a line of its second dimension is a column of the matrix, or vice versa, and the outer codes are defined over a Galois-Field $GF(2^m)$, with m elements of each line of the second dimension representing one symbol of the Galois-Field $GF(2^m)$; and a) a first iteration corresponding to the lowest level of the inner block codes of the original data matrix, wherein the first decoding process includes:

applying a decoding scheme of the inner block code of the lowest level to the lines of the second dimension of the original data matrix with respect to the lowest level of the inner nested block codes in which the lines of a second dimension of the original data matrix are encoded in order to obtain an intermediate decoding data matrix of the first iteration and to determine erasure information characterizing lines of the second dimension of the original data matrix in which an erasure has been detected based on the decoding of the inner block code of the lowest level;

inferring the information bits contained in the lines of the second dimension of the intermediate decoding data matrix of the first iteration in order to retrieve code symbols $(a_{i,j})$ of the outer codes in which the lines of a first dimension of the original data matrix are encoded;

the second decoding process includes:

applying outer decoding corresponding to the respective outer codes to the retrieved code symbols in the lines of the first dimension of the intermediate decoding data matrix of the first iteration in order to obtain a partial decoding result matrix of the first iteration, wherein the erasure information is used during outer decoding to identify erroneous symbols of the outer code in the intermediate decoding data matrix of the first iteration;

re-encoding said partial decoding result matrix of the first iteration by applying an encoding scheme of the inner block code of the lowest level to the second dimension of this matrix to obtain a re-encoded matrix of the first iteration; and subtracting there-encoded matrix of the first iteration from the original data matrix in order to obtain a start matrix for a subsequent further iteration; and (b) for each of the further levels of the inner block codes, a respective further iteration wherein the first decoding step of the respective level includes:

applying a decoding scheme of the inner block code of the current level to the lines of the second dimension of the start matrix of the current iteration with respect to the current level of the inner block codes in which the lines of a second dimension of the start matrix of the current iteration are encoded in order to obtain an intermediate decoding data matrix of the current iteration;

inferring the information bits contained in the lines of the second dimension of the intermediate decoding data matrix of the current iteration in order to retrieve code symbols of the outer codes in which the lines of a first dimension of the original data matrix are encoded;

applying outer decoding corresponding to the respective outer codes used for obtaining the original data matrix during encoding, to the retrieved code symbols in the lines of the first dimension of the intermediate decoding data matrix of the current iteration in order to obtain a partial decoding result matrix of the current iteration;

if the current iteration corresponds to the highest nesting level of the inner block codes in the original data matrix, outputting the partial decoding result matrix of the current iteration as the decoded data, and otherwise, re-encoding said partial decoding result matrix of the current iteration by applying an encoding scheme of the inner block code of the current level to the second dimension of this matrix to obtain a re-encoded matrix of the current iteration, and subtracting there-encoded matrix of the current iteration from the start matrix of the current iteration in order to obtain a start matrix for a subsequent further iteration.

18. The soft input decoding system of claim 14, wherein the instructions executable by the processor are further executable to, in at least one first decoding process using sequential stack decoding, terminating the decoding of a data word in the input data of the inner code of the current level, when:

a maximum possible path length is reached, wherein the trellis path having the best metric value among the paths accrued so far in the stack is selected as the decoded codeword corresponding to the data word; or a predetermined maximum number of iterations have occurred.

19. The soft input decoding system of claim 18, wherein the instructions executable by the processor are further executable to mark the output data of the current first decoding step as an erasure symbol for the corresponding outer code used in the second decoding step of the current level if the termination is caused because a predetermined maximum number of iterations have occurred.

20. The soft input decoding system of claim 14, wherein the instructions executable by the processor are further executable to mark the output data of the current first decoding step as an erasure symbol for the corresponding outer code used in the second decoding step of the current level if the termination is caused because a predetermined maximum number of iterations have occurred.

21. The soft input decoding method of claim 14, wherein the one or more decoding devices comprise:
a plurality of distinct memories or memory areas which can be simultaneously accessed and each of which is configured to store a data representation of a trellis used in a decoding method.

* * * * *